US012670941B2

(12) United States Patent
Cheng et al.

(10) Patent No.: US 12,670,941 B2
(45) Date of Patent: Jun. 30, 2026

(54) MEMORY DEVICE

(71) Applicant: MACRONIX International Co., Ltd., Hsinchu (TW)

(72) Inventors: Chen-Yu Cheng, Hsinchu City (TW); Tzung-Ting Han, Hsinchu City (TW)

(73) Assignee: Macronix International Co., Ltd., Hsinchu (TW)

( * ) Notice: Subject to any disclaimer, the term of this patent is extended or adjusted under 35 U.S.C. 154(b) by 579 days.

(21) Appl. No.: 18/319,834

(22) Filed: May 18, 2023

(65) Prior Publication Data

US 2023/0290396 A1     Sep. 14, 2023

Related U.S. Application Data

(63) Continuation of application No. 17/131,437, filed on Dec. 22, 2020, now Pat. No. 11,727,971.

(51) Int. Cl.
| | |
|---|---|
| *H10B 43/27* | (2023.01) |
| *G11C 8/14* | (2006.01) |
| *H10B 41/10* | (2023.01) |
| *H10B 41/27* | (2023.01) |
| *H10B 41/35* | (2023.01) |
| *H10B 41/41* | (2023.01) |
| *H10B 43/10* | (2023.01) |
| *H10B 43/35* | (2023.01) |
| *H10B 43/40* | (2023.01) |

(52) U.S. Cl.
CPC .............. *G11C 8/14* (2013.01); *H10B 41/10* (2023.02); *H10B 41/27* (2023.02); *H10B 41/35* (2023.02); *H10B 41/41* (2023.02);

*H10B 43/10* (2023.02); *H10B 43/27* (2023.02); *H10B 43/35* (2023.02); *H10B 43/40* (2023.02)

(58) Field of Classification Search
CPC ................................. H10B 43/10; H10B 43/27
See application file for complete search history.

(56) References Cited

U.S. PATENT DOCUMENTS

| | | | | |
|---|---|---|---|---|
| 2019/0393240 A1* | 12/2019 | Kim | ........................ | H10B 43/40 |
| 2020/0185410 A1* | 6/2020 | Xiao | ................... | H01L 23/5226 |
| 2021/0134736 A1* | 5/2021 | Jhothiraman | ..... | H01L 21/76895 |
| 2021/0272900 A1* | 9/2021 | Shin | ................. | H01L 21/76816 |

* cited by examiner

*Primary Examiner* — Christopher A Johnson
(74) *Attorney, Agent, or Firm* — J.C. PATENTS

(57) ABSTRACT

Provided is a memory device including a stack structure. The stack structure is in the memory array region of a substrate. The stack structure comprises a plurality of first insulating layers and a plurality of conductive layers stacked alternately on each other. A first staircase structure and a second staircase structure are located in a first staircase region and a second staircase region of the substrate respectively. The second staircase structure has steps descending from an upper layer proximal to the memory array region to a lower layer distal to the memory array region. Block slits and zone slit are disposed over the substrate in the second staircase region. The block slits divide the stack structure, the first staircase structure and the second staircase structure into memory blocks. The zone slits divide one of the memory blocks into a plurality of zones separately within the memory blocks.

18 Claims, 26 Drawing Sheets

MEMORY DEVICE

CROSS-REFERENCE TO RELATED APPLICATION

This application is a continuation application of and claims the priority benefit of U.S. application Ser. No. 17/131,437, filed on Dec. 22, 2020. The entirety of the above-mentioned patent application is hereby incorporated by reference herein and made a part of this specification.

BACKGROUND

Technical Field

The embodiment of the disclosure relates to a semiconductor device and a fabrication method thereof, and particularly, to a memory device and a fabrication method thereof.

Description of Related Art

Since a non-volatile memory device (e.g., a flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory.

SUMMARY

The disclosure provides a memory device, in which multiple word lines of two adjacent blocks are separated from each other.

An embodiment of the disclosure provides a memory device including a substrate. The substrate has a first staircase region, a second staircase region and a memory array region. The memory array region is located between the first staircase region and the second staircase region. A stack structure is in the memory array region. The stack structure comprises a plurality of first insulating layers and a plurality of conductive layers stacked alternately on each other. A first staircase structure is located in the first staircase region. The first staircase structure comprises the plurality of first insulating layers and the plurality of conductive layers stacked alternately on each other. A second staircase structure is located in the second staircase region. The second staircase structure comprises the plurality of first insulating layers and the plurality of conductive layers stacked alternately on each other. The second staircase structure has steps descending from an upper layer proximal to the memory array region to a lower layer distal to the memory array region. Block slits and zone slit are disposed over the substrate in the second staircase region. The block slits divide the stack structure, the first staircase structure and the second staircase structure into memory blocks. The zone slits divide one of the memory blocks into a plurality of zones separately within the memory blocks.

At least one embodiment of the disclosure provides a memory device including a substrate. The substrate has a first staircase region, a second staircase region and a memory array region. The memory array region is located between the first and second staircase regions. A stack structure is in the memory array region. The stack structure comprises a plurality of first insulating layers and a plurality of conductive layers stacked alternately on each other. A first staircase structure is located in the first staircase region. The first staircase structure comprises the plurality of first insulating layers and the plurality of conductive layers stacked alternately on each other. A second staircase structure is located in the second staircase region. The second staircase structure comprises the plurality of first insulating layers and the plurality of conductive layers stacked alternately on each other, and has steps descending from an upper layer proximal to the memory array region to a lower layer distal to the memory array region. At least two block slits and at least zone slit are disposed over the substrate in the second staircase region. The at least two block slits divide the stack structure, the first staircase structure and the second staircase structure to define a memory block. The at least one zone slit divides the memory block into two adjacent zones within the memory block separately.

To make the aforementioned more comprehensible, several embodiments accompanied with drawings are described in detail as follows.

DESCRIPTION OF THE EMBODIMENTS

Figure 1:
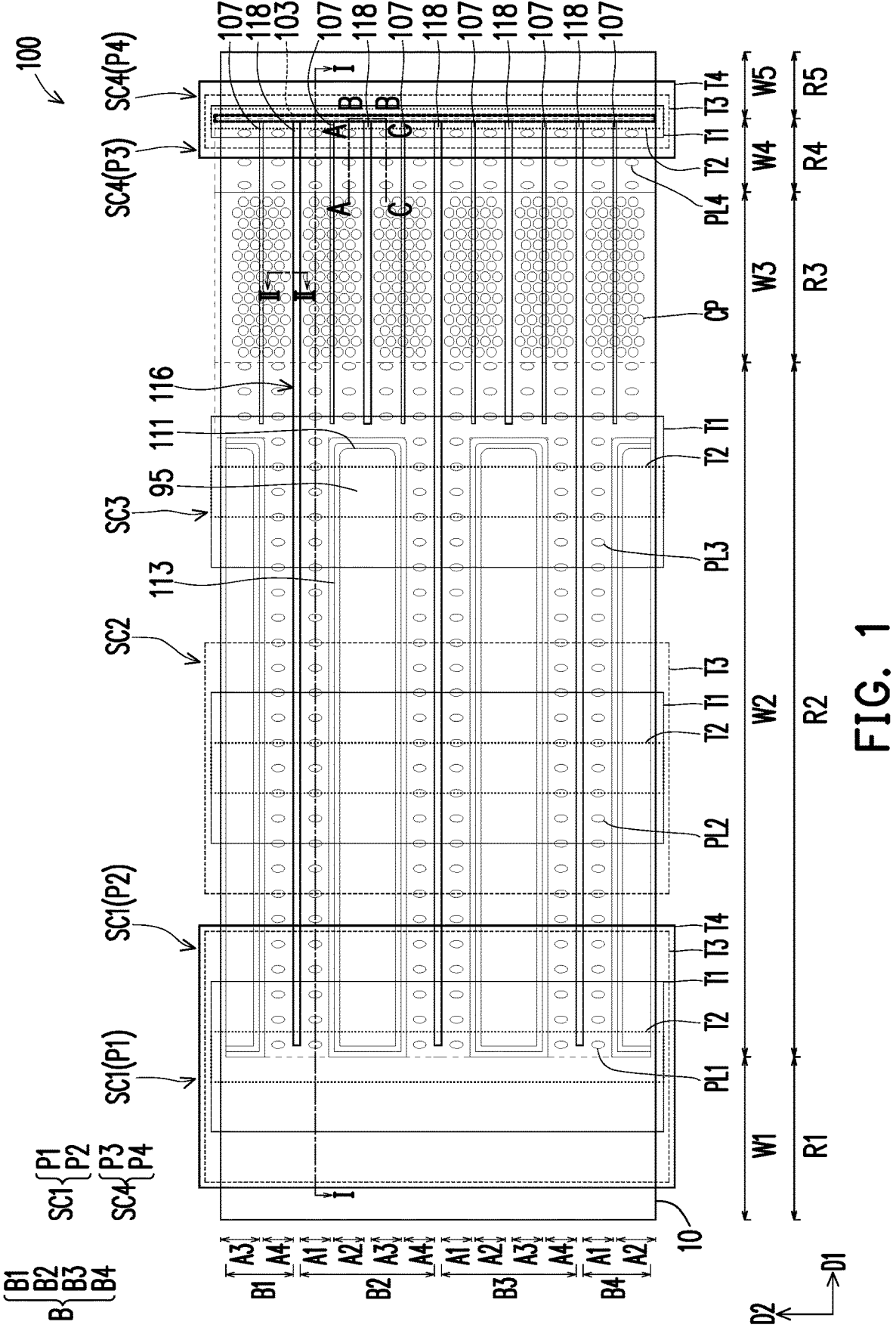
FIG. 1 is a top view of a three-dimensional memory device according to an embodiment of the disclosure.
Figure 2A:
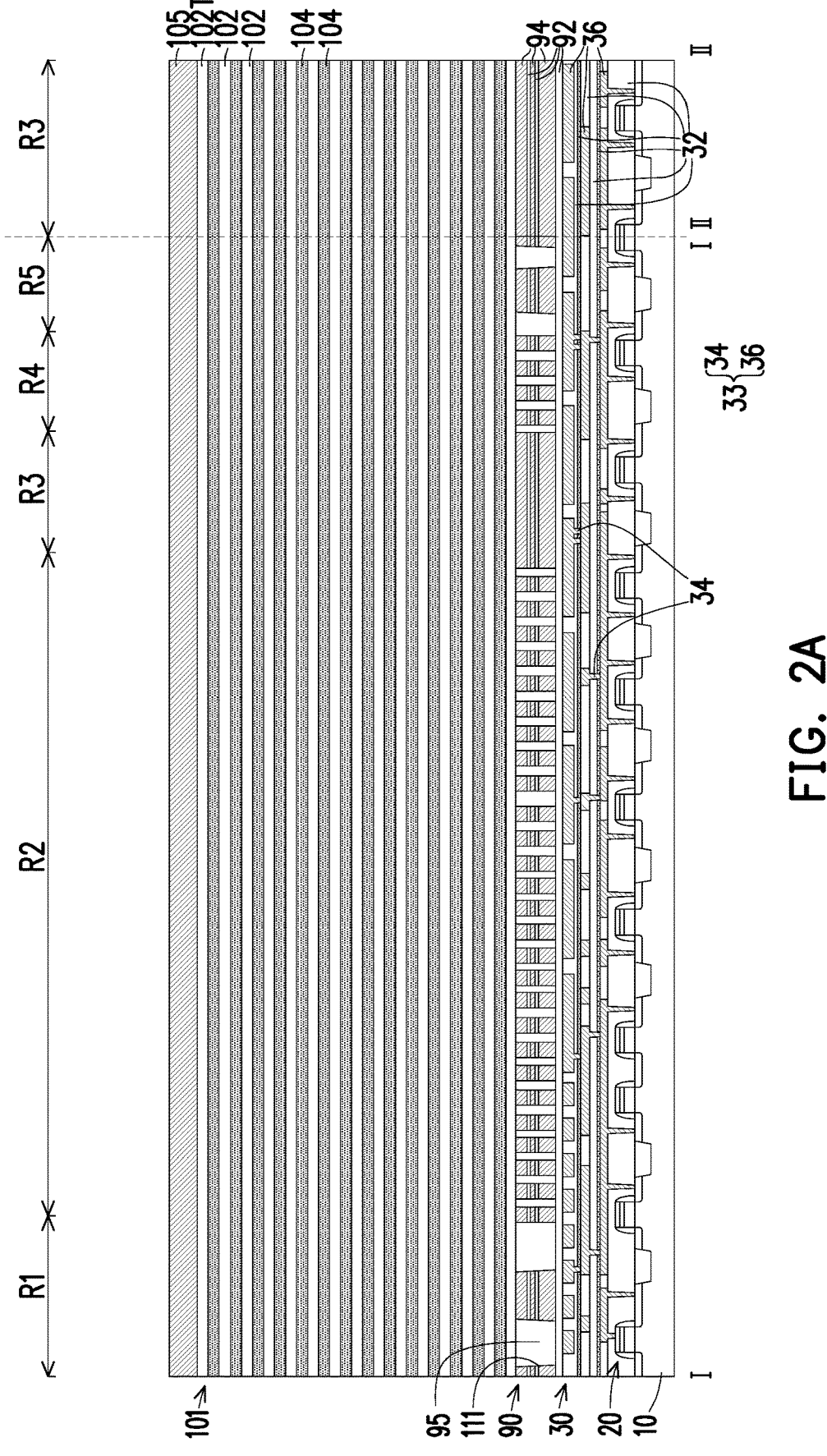
FIG. 2A to FIG. 2P are schematic cross-sectional views of a method of fabricating a three-dimensional memory device according to an embodiment of the disclosure.

FIG. 1 is a top view of a three-dimensional memory device according to an embodiment of the disclosure. FIG. 2A to FIG. 2P are schematic cross-sectional views of a method for fabricating a three-dimensional memory device according to an embodiment of the disclosure. FIG. 2A to FIG. 2P are schematic cross-sectional views taken along line I-I of FIG. 1. For clarity, only some of the components are shown in FIG. 1.

Referring to FIG. 1 and FIG. 2A, a three-dimensional memory device 100 is formed on a substrate 10. Along a direction D2, the substrate 10 is divided into a plurality of blocks B arranged along a direction D2, such as blocks B1, B2, B3, and B4. Along the direction D1, each block B includes a periphery region R1, a staircase region R2, a memory array region R3, a word line cutting region R4, and a periphery region R5. Along the direction D2, each block B includes a first zone A1, a second zone A2, a third zone A3, and a fourth zone A4.

The three-dimensional memory device 100 includes a plurality of source line slits 118 and a plurality of selective line cut slit 107 extending along the direction D1. There are some source line slits 118 between the fourth zone A4 of a block B (e.g., the block B1) and the first zone A1 of an adjacent block B (e.g., the block B2), and extend from the staircase region R2, to the word line cutting region R4. There are other source line slits 118 between the second zone A2 and the third zone A3 of each block B, and extend from the memory array area R3 to the word line cutting area R4. The selective line cut slit 107 is located between the first zone A1 and the second zone A2, and between the third zone A3 and the second zone A4 of each block B.

In the embodiment of the disclosure, the word line cutting region R4 and the peripheral region R5 of the three-dimensional memory device 100 have a staircase structure SC4. The staircase structure SC4 includes a part P3 and a part P4. The part P3 and the part P4 are respectively located in the word line cutting region R4 and the peripheral region R5, and are separated from each other by a dielectric layer 103. In this way, word lines between two adjacent blocks B may be separated from each other.

The three-dimensional memory device 100 may be manufactured with reference to the manufacturing method of FIGS. 2A to 2P, but the disclosure is not limited thereto.

Referring to FIG. 2A, a device layer 20 and a metal interconnect structure 30 are sequentially formed on the substrate 10. The substrate 10 may be a semiconductor substrate, such as a silicon-containing substrate. The device layer 20 may include an active device or a passive device. The active device is, for example, a transistor, a diode, etc. The passive device is, for example, a capacitor, an inductor, etc. The transistor may be an N-type metal oxide semiconductor (NMOS) transistor, a P-type metal oxide semiconductor (PMOS) transistor, or a complementary metal oxide semiconductor (CMOS).

The metal interconnect structure 30 may include a multi-layered dielectric layer 32 and a metal interconnect 33 formed in the multi-layered dielectric layer 32. The metal interconnect 33 includes a plurality of plugs 34, a plurality of conductive lines 36, etc. The dielectric layer 32 separates adjacent conductive lines 36. The conductive lines 36 may be connected to each other via the plugs 34, and the conductive lines 36 may be connected to the device layer 20 via the plugs 34.

Referring to FIG. 2A, a stack structure 90 is formed on the metal interconnect structure 30. The stack structure 90 includes a plurality of insulating layers 92 and a plurality of conductive layers 94 stacked alternately on each other. In an embodiment, the material of the insulating layer 92 includes silicon oxide, and the material of the conductive layer 94 includes doped polysilicon.

Referring to FIG. 1 and FIG. 2A, the stack structure 90 is patterned to form grooves 111, and the grooves 111 are filled with a dielectric layer 95 such as silicon oxide. A stack structure 101 is formed on the stack structure 90. The stack structure 101 includes a plurality of insulating layers 102 and a plurality of sacrificial layers 104 stacked alternately on each other. The insulating layers 102 include a top insulating layer 102T, insulating layers $102_{14}$, $102_{13}$, $102_{12}$, $102_{11}$, $102_{10}$, $102_9$, $102_8$, $102_7$, $102_6$, $102_5$, $102_4$, $102_3$, $102_2$, and $102_1$. The sacrificial layers 104 include sacrificial layers $104_{14}$, $104_{13}$, $104_{12}$, $104_{11}$, $104_{10}$, $104_9$, $104_8$, $104_7$, $104_6$, $104_5$, $102_4$, $102_3$, $102_2$, and $102_1$. The insulating layer 102 and the sacrificial layer 104 may also be respectively referred to as a first insulating layer 102 and a second insulating layer 104. In an embodiment, the material of the insulating layer 102 includes silicon oxide, and the material of the sacrificial layer 104 includes silicon nitride. Afterwards, a stop layer 105 is formed on the stack structure 101.

The material of the stop layer 105 is different from those of the insulating layer 102 and the sacrificial layer 104 and may be, for example, polysilicon. In an embodiment, the stack structure 101 and the stop layer 105 are located on the periphery region R1, the staircase region R2, the memory array region R3, the word line cutting region R4, and the periphery region R5 of each block B.

Figure 2B:
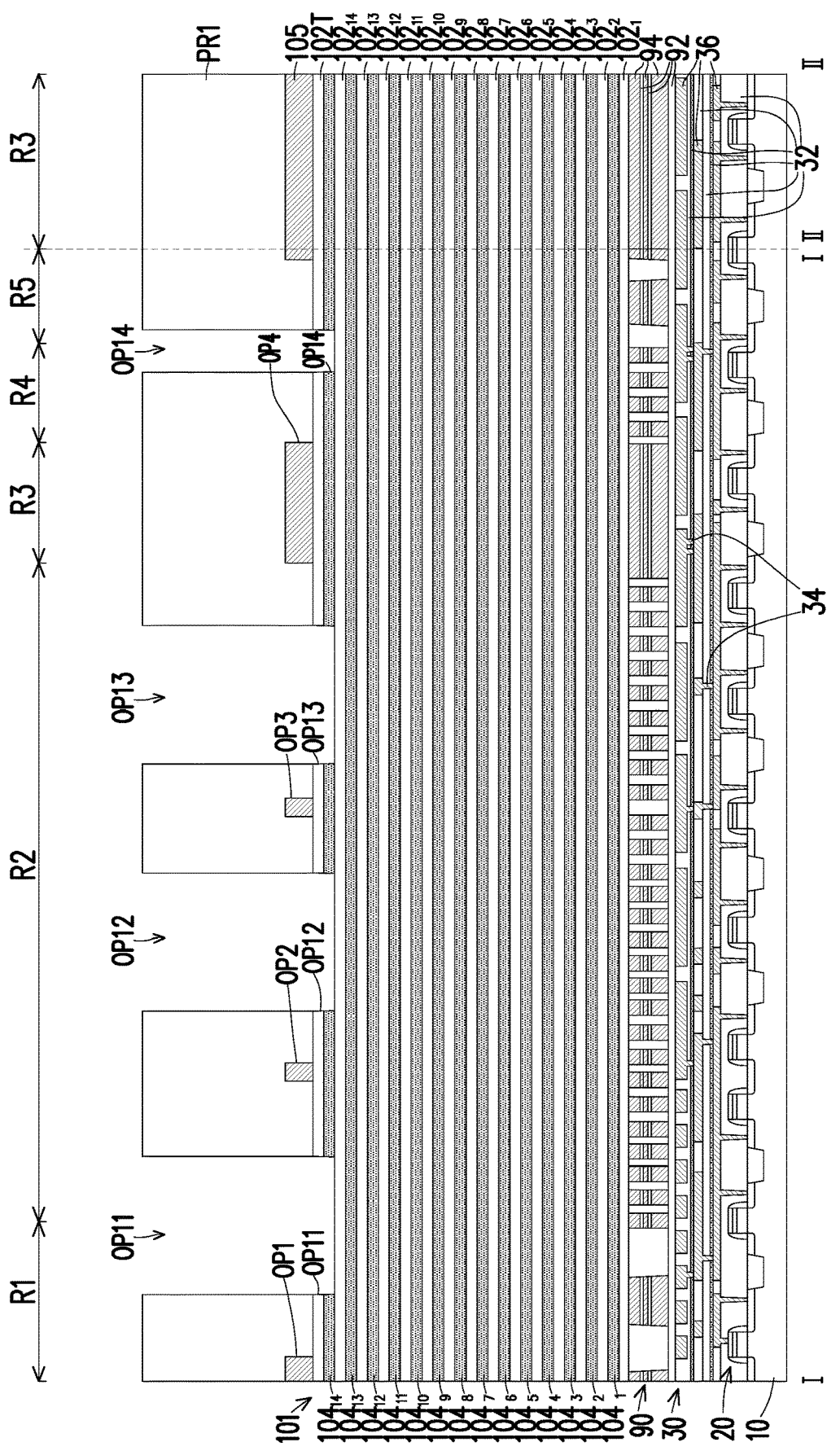
Figure 2C:
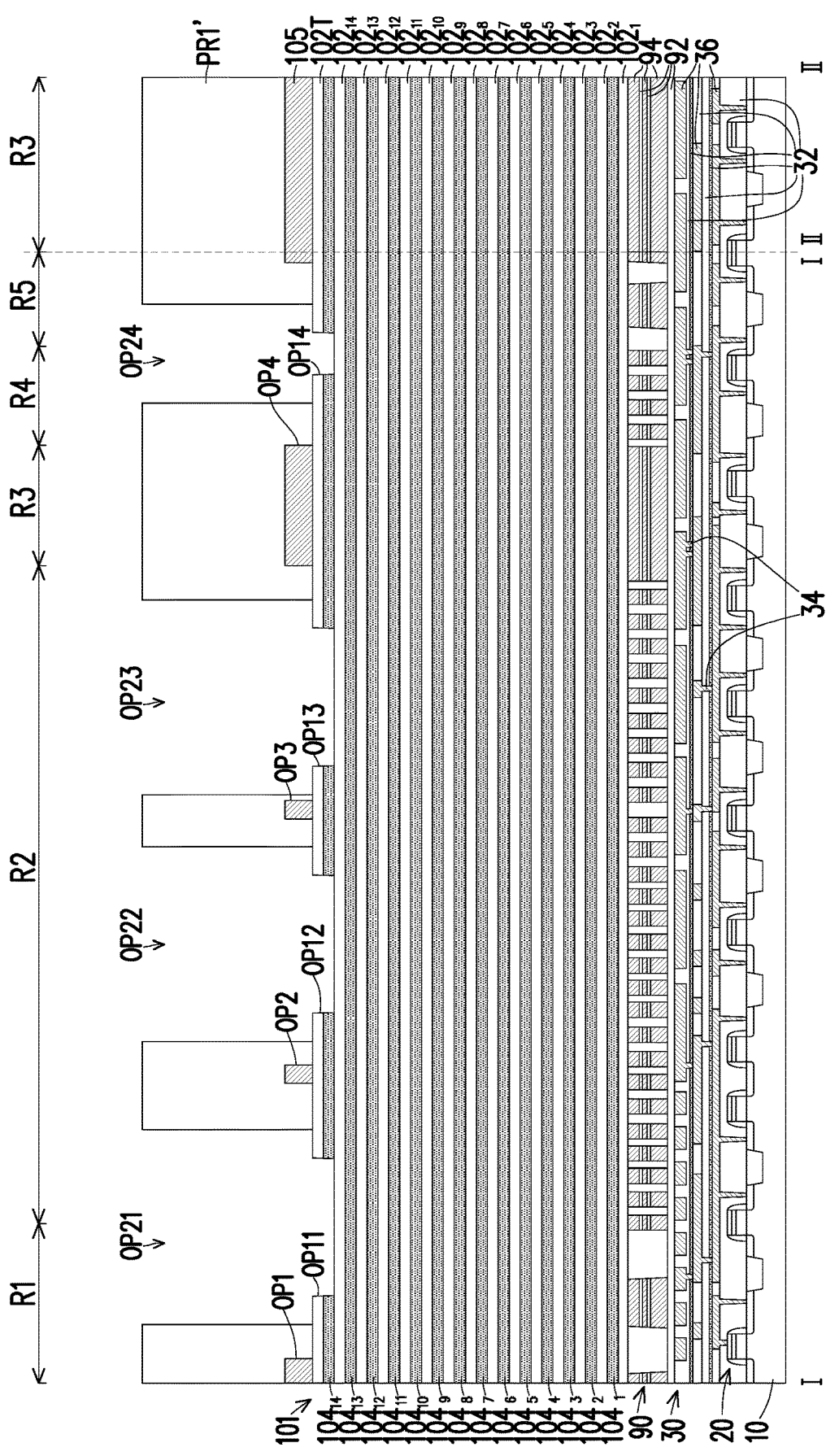
Figure 2D:
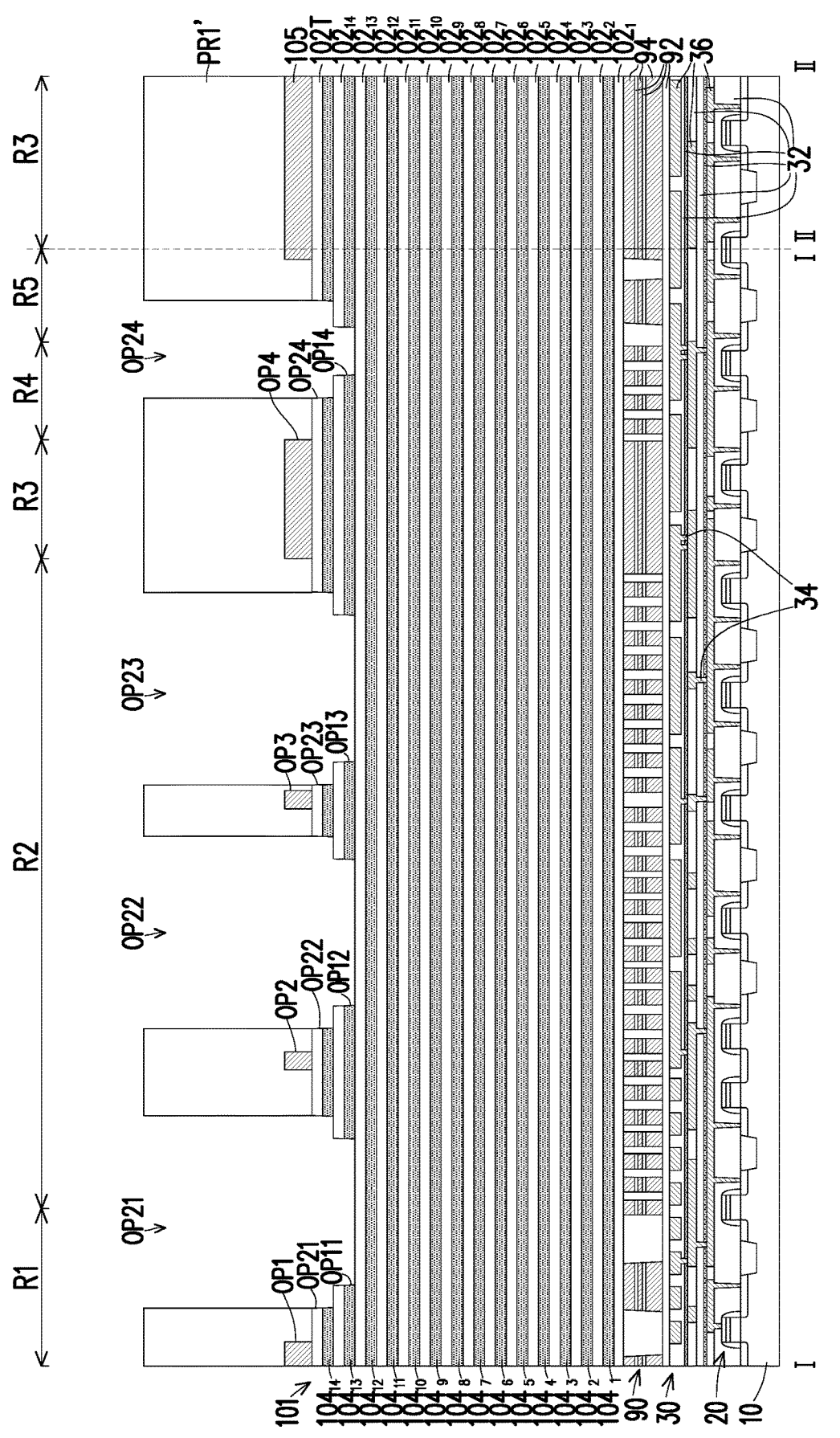
Figure 2E:
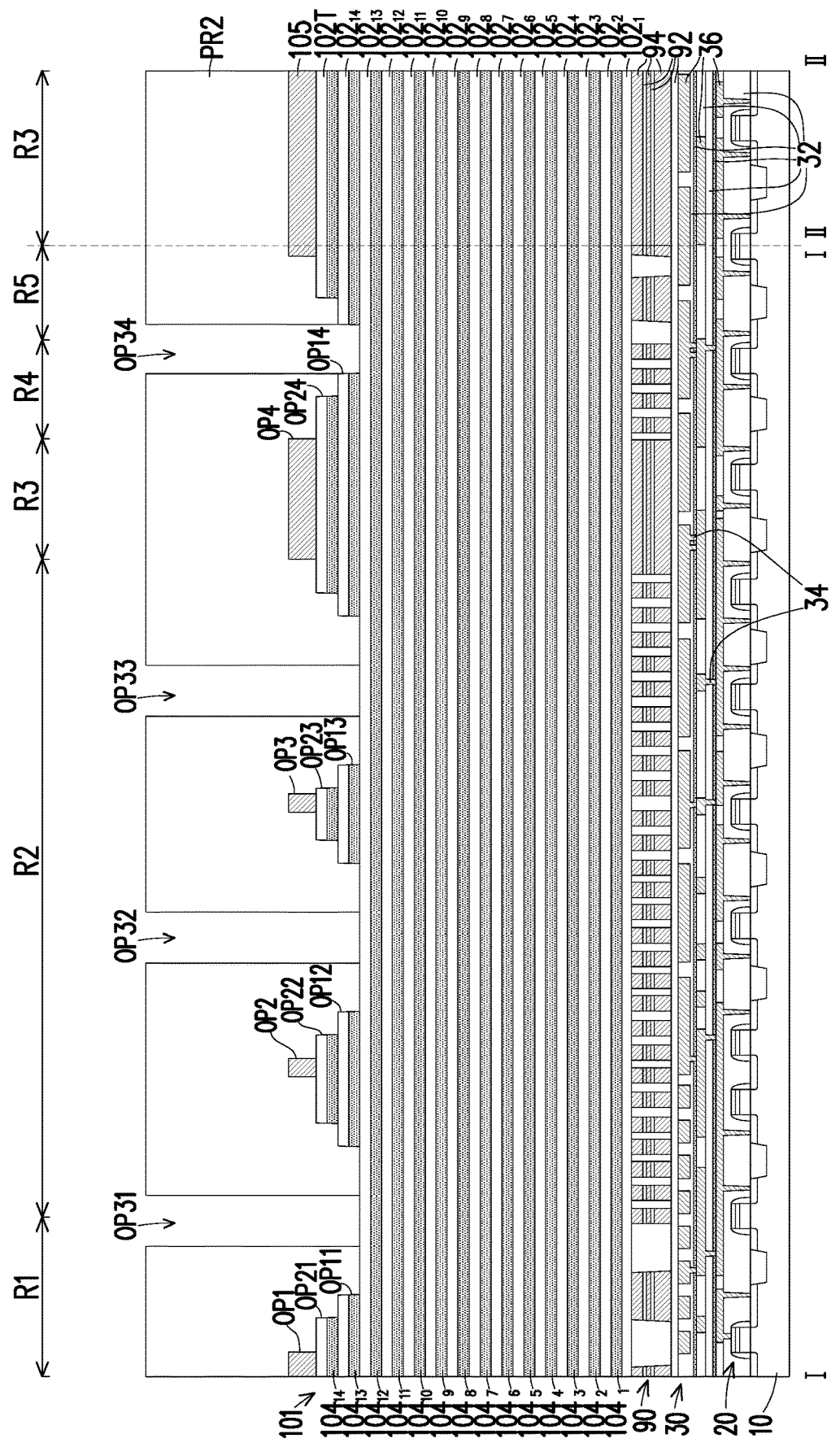
Figure 2F:
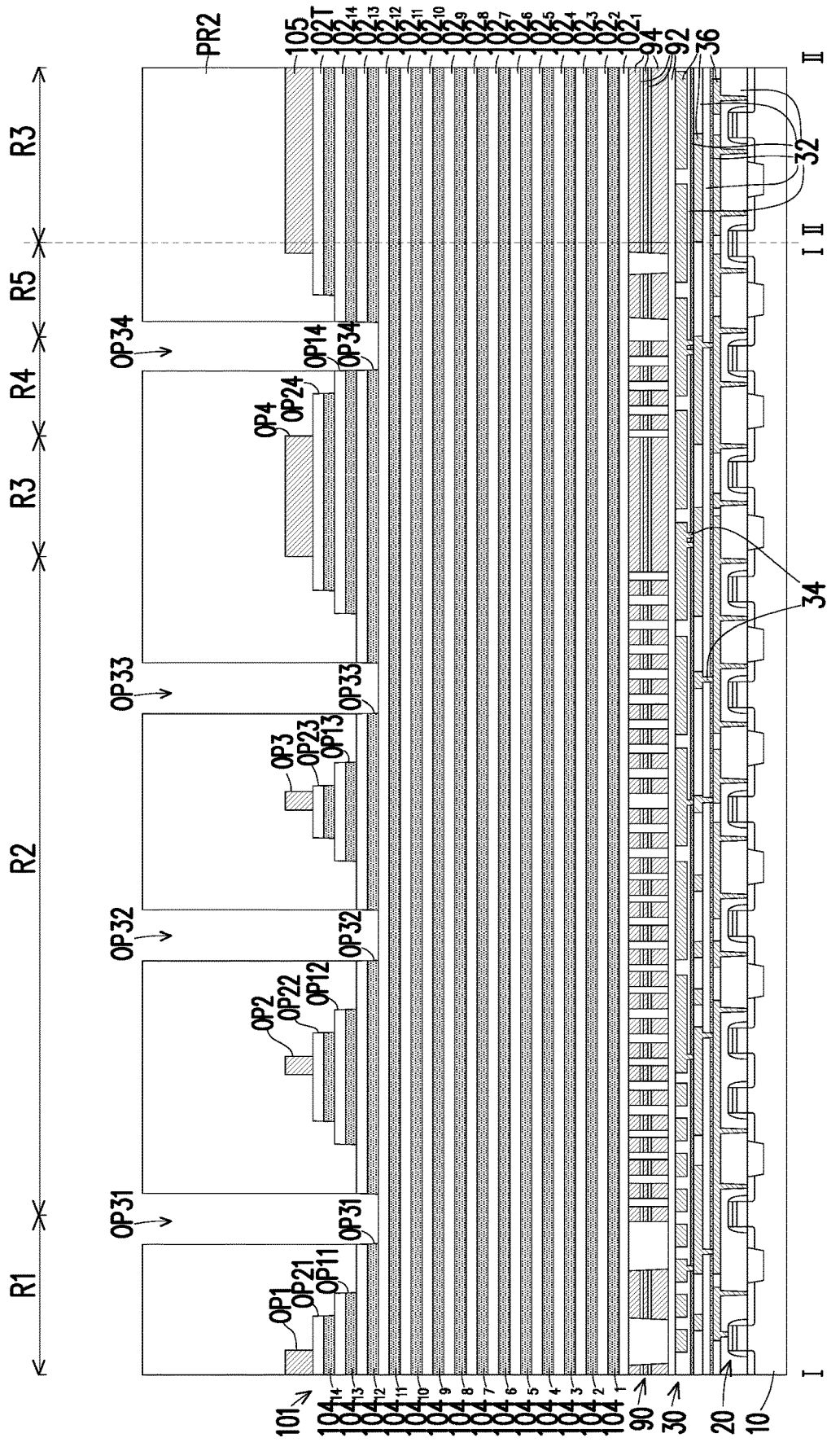
Figure 2G:
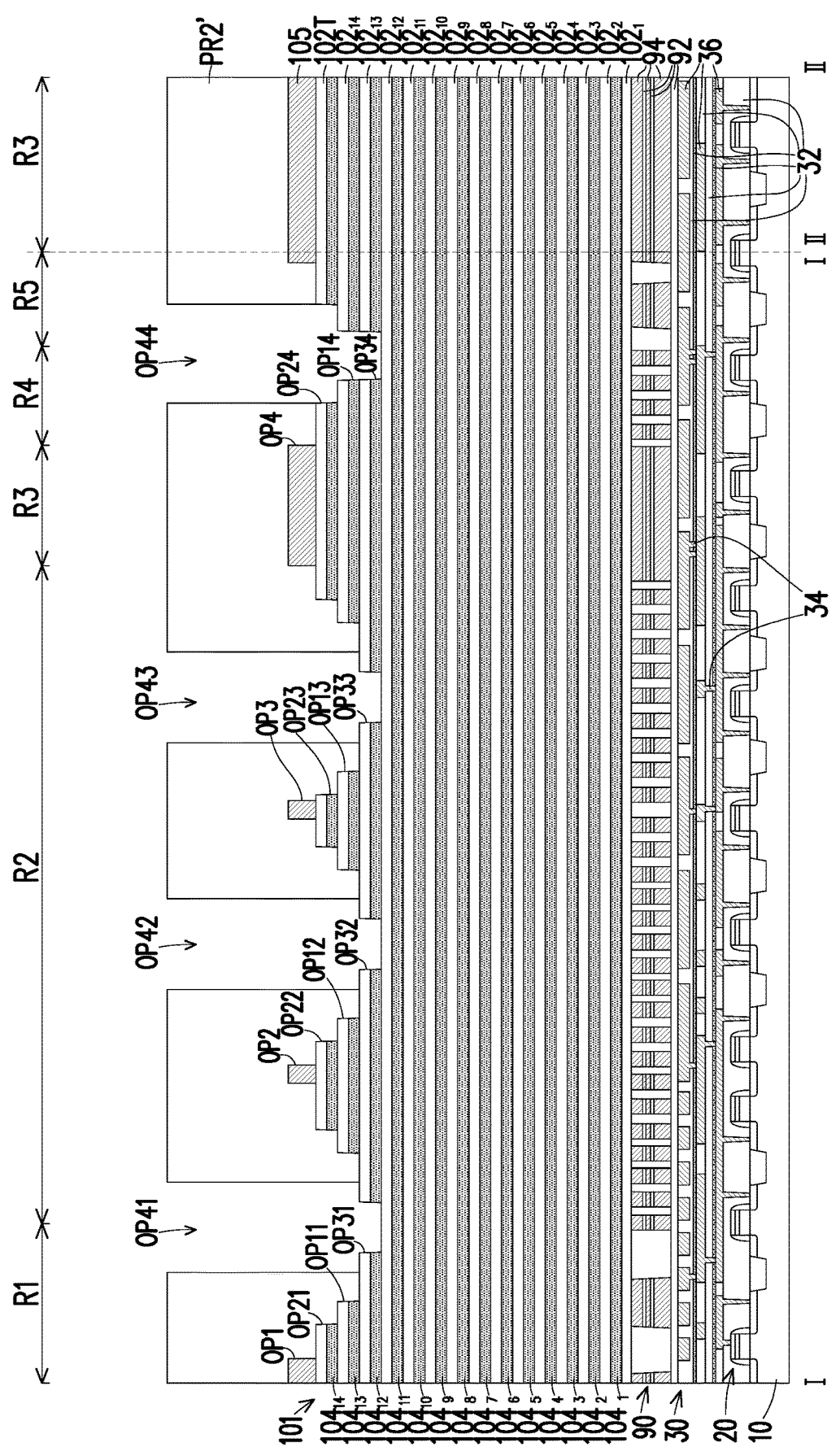
Figure 2H:
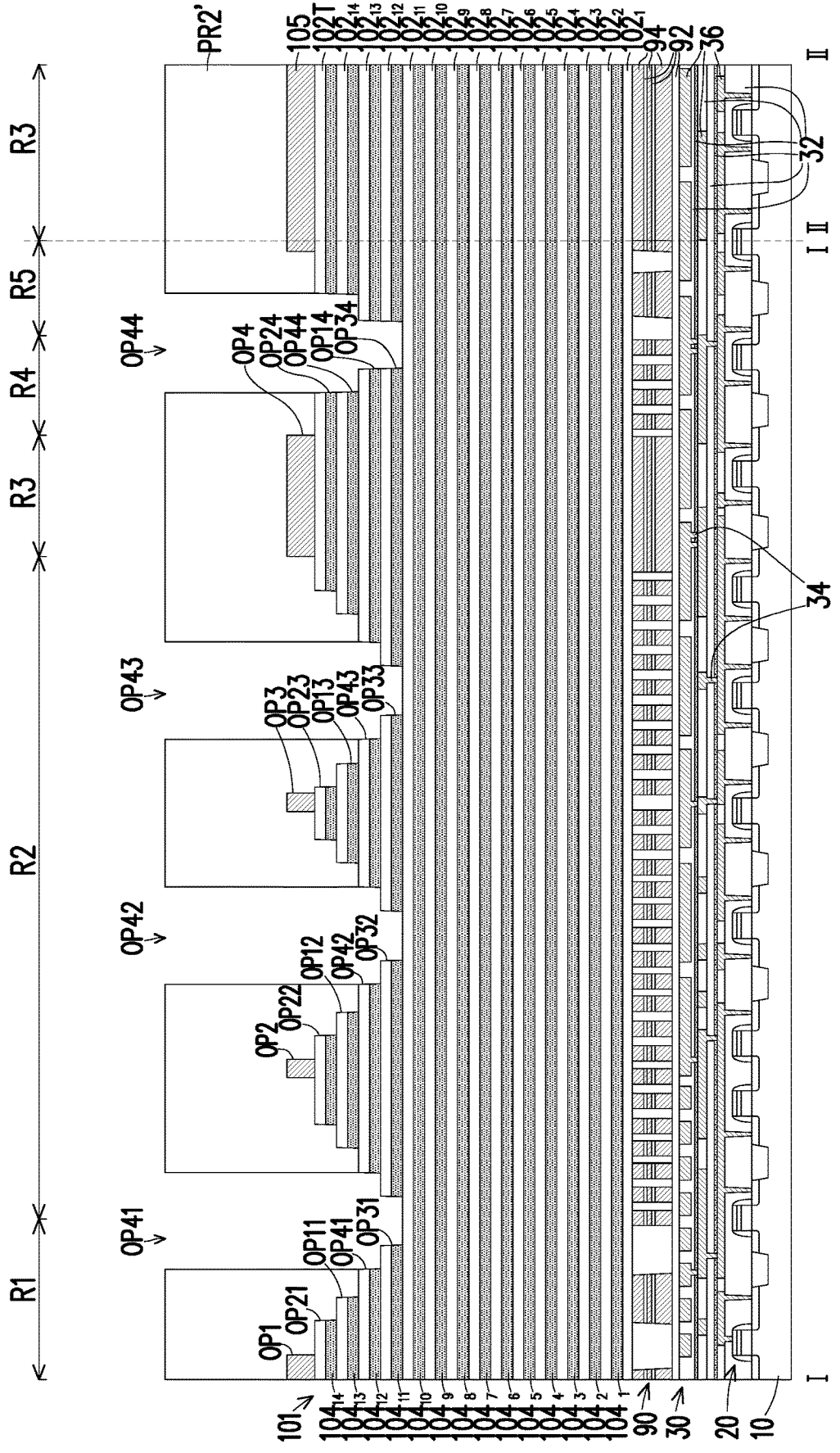
Figure 21:
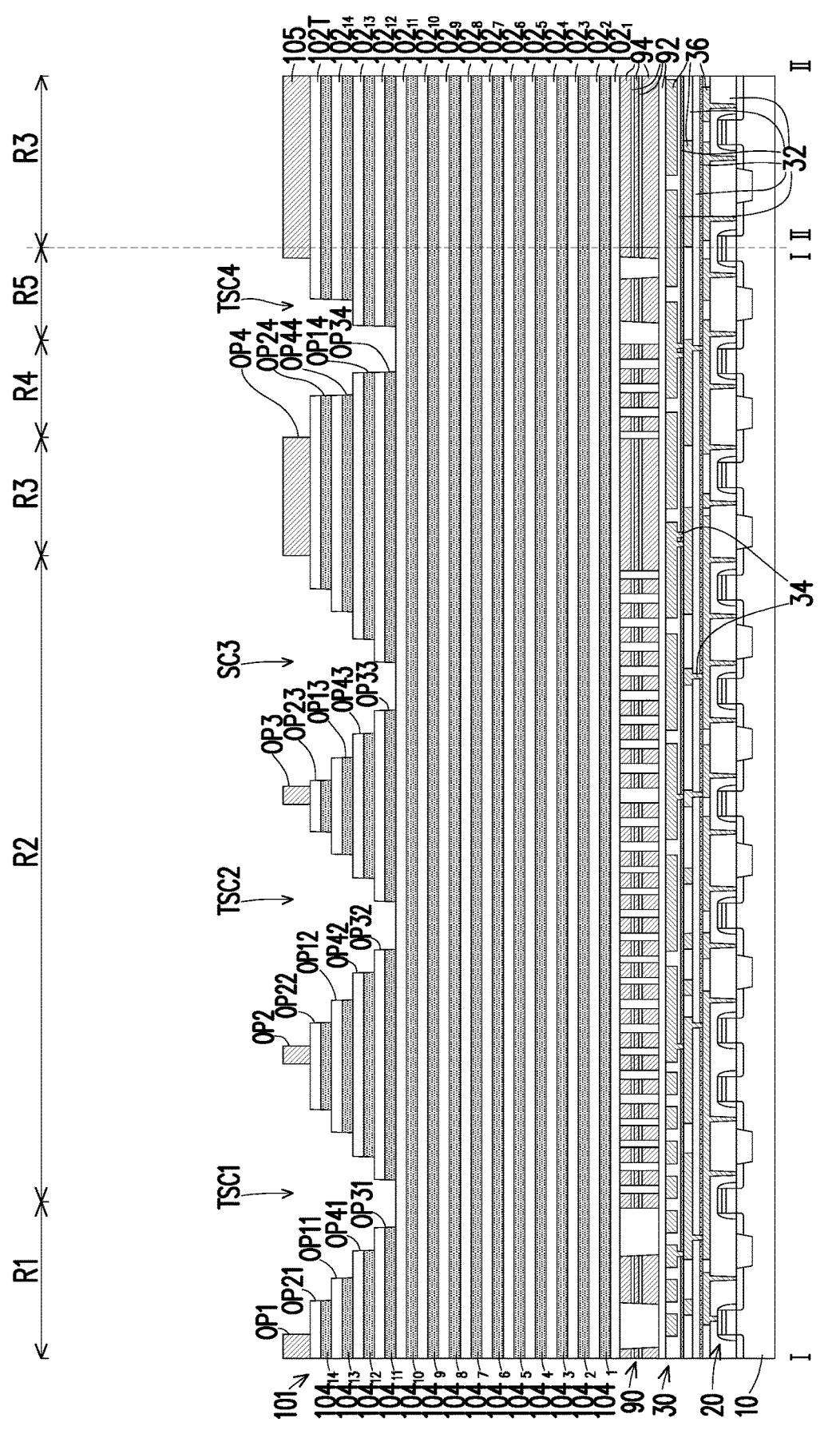
Figure 2J:
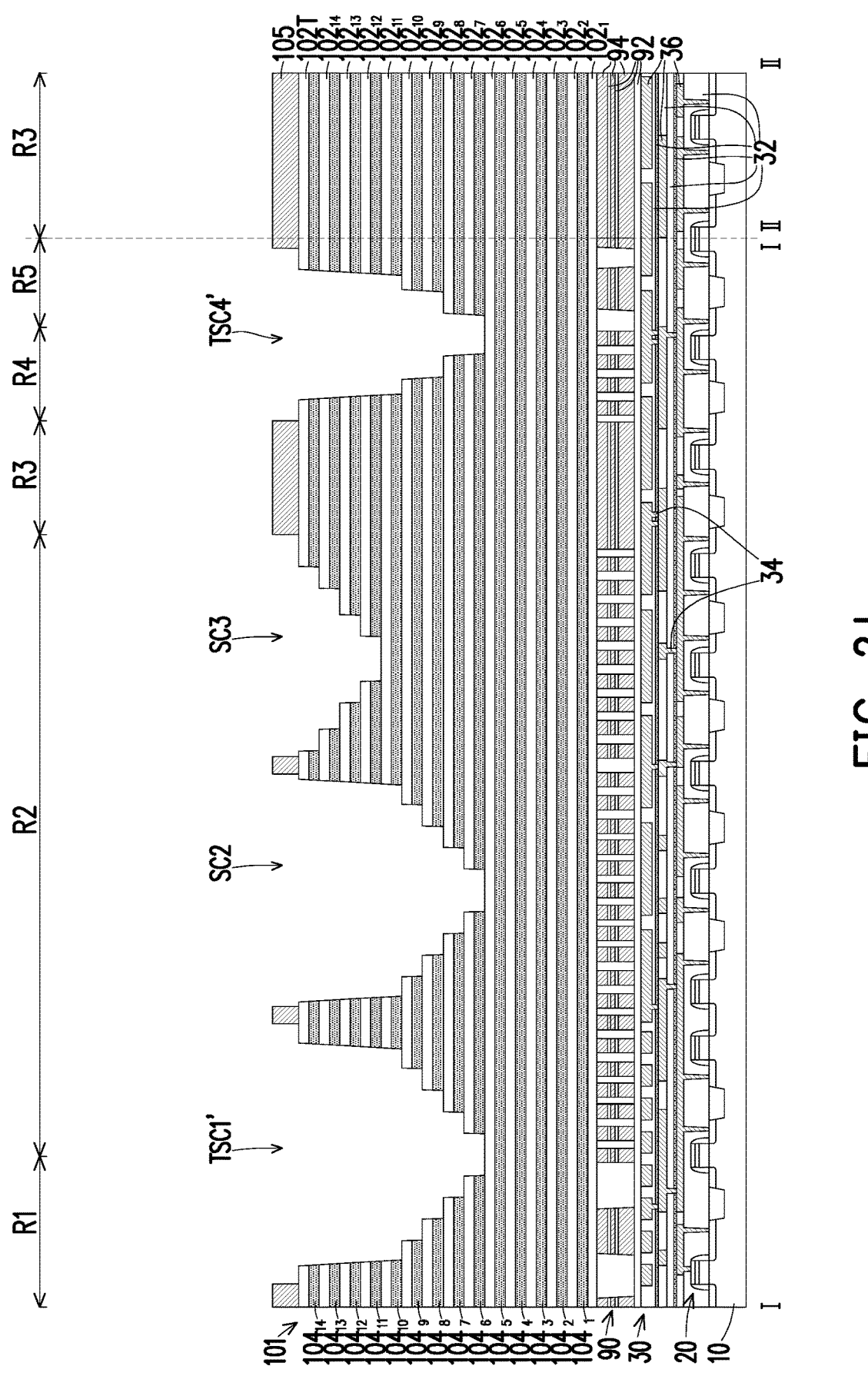
Figure 2K:
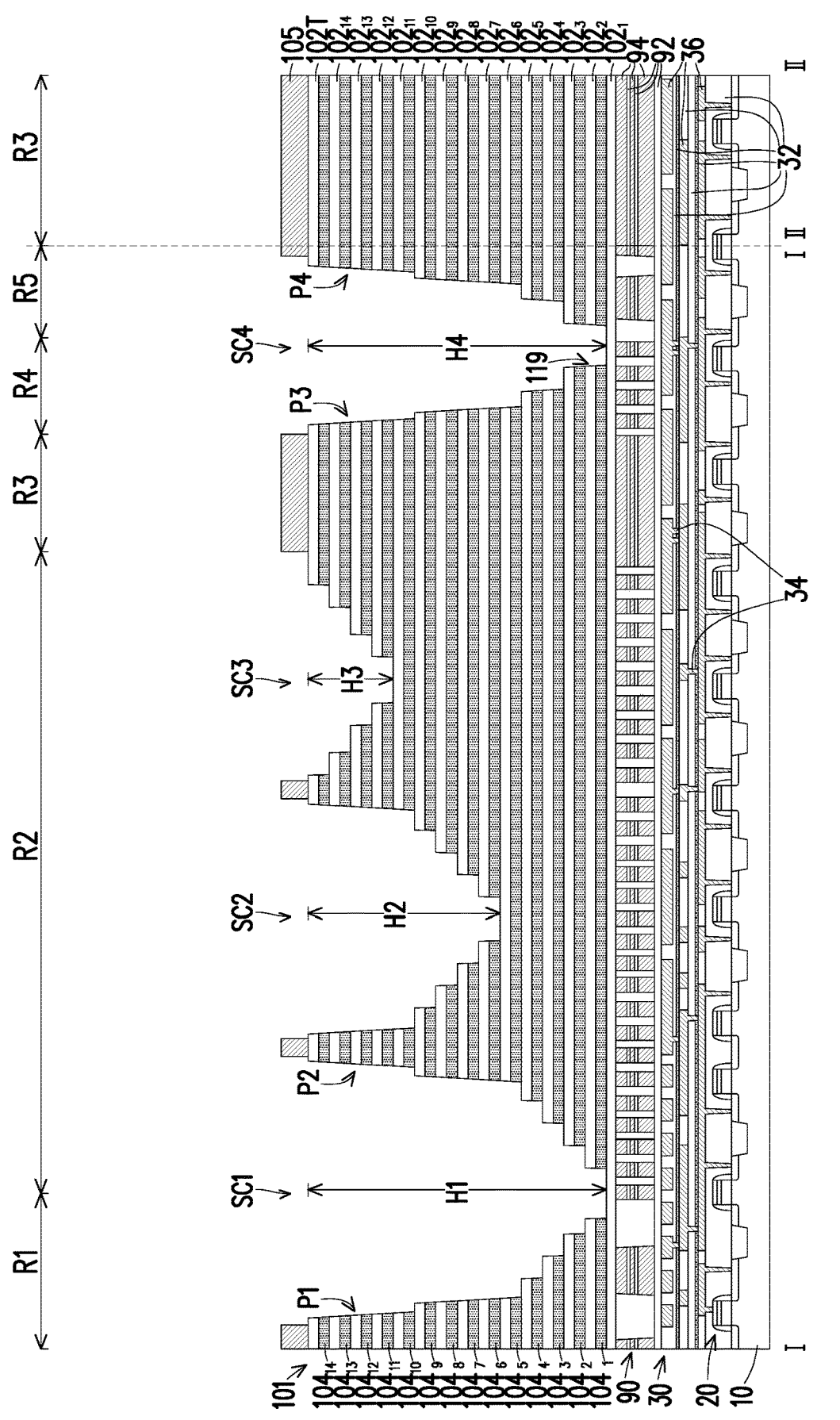

Referring to FIG. 2B to FIG. 2K, the sacrificial layer 104 and the insulating layer 102 of the stack structure 101 in the periphery region R1, the staircase region R2, the word line cutting region R4, and the periphery region R5 are patterned to respectively form staircase structures SC1. SC2, SC3 and SC4, as shown in FIG. 2B to FIG. 2K. In some embodiments, the staircase structures SC1, SC2, SC3, and SC4 are formed through a four-stage patterning process, but the disclosure is not limited thereto. FIG. 2B to FIG. 2D illustrate a patterning process of a first stage T1. FIG. 2E to FIG. 2I illustrate a patterning process of a second stage T2. FIG. 2J illustrates a patterning process of a third stage T3. FIG. 2K illustrates a patterning process of a fourth stage T4.

Referring to FIG. 2B, the stop layer 105 is patterned to form openings OP1, OP2, OP3, and OP4. The opening OP1 exposes the top insulating layer 102T of the stack structure 101 in the periphery region R1 and the staircase region R2, the opening OP2 exposes the top insulating layer 102T of the stack structure 101 in the staircase region R2, the opening OP3 exposes the top insulating layer 102T of the stack structure 101 in the staircase region R2, and the opening OP4 exposes the top insulating layer 102T of the stack structure 101 in the word line cutting region R4 and the periphery region R5.

Referring to FIGS. 1 and 2B, the patterning process of the first stage T1 is performed. A mask layer PR1 is formed on the stop layer 105 and the top insulating layer 102T. The mask layer PR1 is, for example, a patterned photoresist layer. The mask layer PR1 has openings OP11, OP12, OP13, and OP14, which are respectively smaller than the openings OP1, OP2, OP3, and OP4. Then, an etching process is performed by using the mask layer PR1 as a mask to pattern the stack structure 101 and thereby transfer the patterns of the openings OP11, OP12, OP13, and OP14 to the top insulating layer 102T and a sacrificial layer $104_{14}$.

Referring to FIG. 2C, the mask layer PR1 is trimmed to form a mask layer PR1'. The mask layer PR1' has openings OP21, OP22, OP23, and OP24, which are respectively larger than the openings OP11, OP12, OP13. OP14, respectively smaller than the openings OP1, OP2, OP3 and OP4, and expose the top surfaces of the top insulating layer 102T and a top insulating layer $102_{14}$ and the sidewalls of the top insulating layer 102T and the sacrificial layer $104_{14}$.

Referring to FIG. 2D, an etching process is performed by using the mask layer PR1' and the top insulating layer 102T and the sacrificial layer $104_{14}$ having the openings OP11, OP12, OP13, and OP14 as a mask to pattern the stack structure 101 and thereby transfer the patterns of the openings OP21, OP22, OP23 and OP24 to the top insulating layer 102T and the sacrificial layer $104_{14}$, and transfer the patterns of the openings OP11, OP12, OP13, OP14 to the insulating layer $102_{14}$ and a sacrificial layer $104_{13}$.

Referring to FIGS. 1 and 2E, after the mask layer PR1' is removed, the patterning process of the second stage T2 is performed. A mask layer PR2 is formed on the stop layer 105 and the stack structure 101. The mask layer PR2 is, for example, a patterned photoresist layer. The mask layer PR2 has openings OP31, OP32, OP33, and OP34. The openings OP31, OP32, and OP33 are respectively smaller than the openings OP11, OP12, and OP13. The size of the opening OP34 is equal to that of the opening OP14, and the opening OP34 is flush with the opening OP14.

Referring to FIG. 2F, an etching process is performed by using the mask layer PR2 as a mask to pattern the stack structure 101 and thereby transfer the patterns of the openings OP31, OP32. OP33, and OP34 to an insulating layer $102_{13}$ and a sacrificial layer $104_{12}$.

Referring to FIG. 2G, the mask layer PR2 is trimmed to form a mask layer PR2'. The mask layer PR2' has openings OP41, OP42, and OP43, which are respectively larger than the openings OP31, OP32, and OP33, and respectively smaller than the openings OP11, OP12, and OP13. The opening OP41 is larger than the openings OP14 and OP34, and the size of the opening OP41 is equal to that of the opening OP24. The openings OP41. OP42, and OP43 respectively expose the top surfaces of the insulating layer $102_{13}$ and $102_{12}$ and the sidewalls of the insulating layer $102_{13}$ and the sacrificial layer $104_{12}$. The opening OP44 exposes the top surfaces of the insulating layers $102_{14}$ and $102_{12}$ and the sidewalls of the top insulating layer 102T, the insulating layers $102_{14}$ and $102_{13}$, and the sacrificial layers $104_{14}$, $104_{13}$, and $104_{12}$.

Referring to FIG. 2H, the stack structure 101 is patterned by using the mask layer PR2', the insulating layer $102_{13}$ and the sacrificial layer $104_{12}$ having the openings OP31, OP32, and OP33, and the insulating layer $102_{14}$ and the sacrificial layer $104_{13}$ having the opening OP14 as a mask. The patterns of the openings OP41. OP42, and OP43 are transferred to the insulating layer $102_{13}$ and the sacrificial layer $104_{12}$. The pattern of the opening OP44 is transferred to the insulating layer $102_{14}$ and the sacrificial layer $104_{13}$. The patterns of the openings OP31, OP32, and OP33, and the opening OP14 are transferred to the insulating layer $102_{12}$ and a sacrificial layer $104_{11}$.

Referring to FIG. 2I, the mask layer PR2' is removed. At this time, transitional staircase structures TSC1 and TSC2, the staircase structure SC3, and a transitional staircase structure TSC4 are formed.

Referring to FIGS. 1 and 2J, the patterning process of the third stage T3 is performed. A mask layer (not shown) is formed to perform a selective etching process on the transitional staircase structures TSC1, TSC2, and TSC4 to thereby form a transitional staircase structure TSC1', the staircase structure SC2, and a transitional staircase structure TSC4'. Afterwards, the mask layer is removed.

Referring to FIGS. 1 and 2K, the patterning process of the fourth stage T4 is performed. A mask layer (not shown) is formed to perform a selective etching process on the transitional staircase structures TSC1' and TSC4' to thereby form the staircase structures SC1 and SC4. The staircase structure SC1 is located in the periphery region R1 and the staircase region R2. The staircase structures SC2 and SC3 are located in the staircase region R2. The staircase structure SC4 is located in the word line cutting region R4 and the periphery region R5. Afterwards, the mask layer is removed.

The side profiles of the staircase structures SC1, SC2, SC3, and SC4 are substantially symmetrical. The staircase structures SC1 and SC4 extend in a direction toward the substrate 10 until they expose the insulating layer $102_1$. Therefore, a depth H1 of the staircase structure SC1 is greater than a depth H2 of the staircase structure SC2. The depth H2 of the staircase structure SC2 is greater than a depth H3 of the staircase structure SC3. A depth H4 of the staircase structure SC4 is equal to the depth H1 of the staircase structure SC1. However, the number of steps in the staircase structure SC4 is less than the number of steps in the staircase structure SC1. For example, in FIG. 2K, the number of steps in the staircase structure SC4 is 4, and the number of steps in the staircase structure SC1 is 6. The height of the first step of the staircase structure SC4 is the sum of the heights of the first step and the second step of the staircase structure SC1. The height of the second step of the staircase structure SC4 is the sum of the heights of the third step and the fourth step of the staircase structure SC1. The height of the third step of the staircase structure SC4 is equal to the height of the fifth step of the staircase structure SC1. The height of the fourth step of the staircase structure SC4 is equal to the height of the sixth step of the staircase structure SC1.

In addition, the staircase structure SC1 includes parts P1 and P2, and the staircase structure SC4 includes parts P3 and P4. The part P1 is located in the periphery region R1, and the part P2 is located in the staircase region R2. The part P1 and the part P2 are separated from each other. The part P3 is located in the word line cutting region R4, and the part P4 is located in the periphery region R5. The part P3 and the part P4 are separated from each other.

Referring to FIG. 1 and FIG. 2K, furthermore, the part P2 of the staircase structure SC1, the staircase structures SC2 and SC3, and the part P3 of the staircase structure SC4 are located in the first zone A1, the second zone A2, the third zone A3 and the fourth zone A4 of the staircase region R2 of each block B. In the memory array region R3, the stop layer 105 and the stack structures 101 and 90 are not patterned, and therefore, the staircase structure is not formed.

Figure 2L:
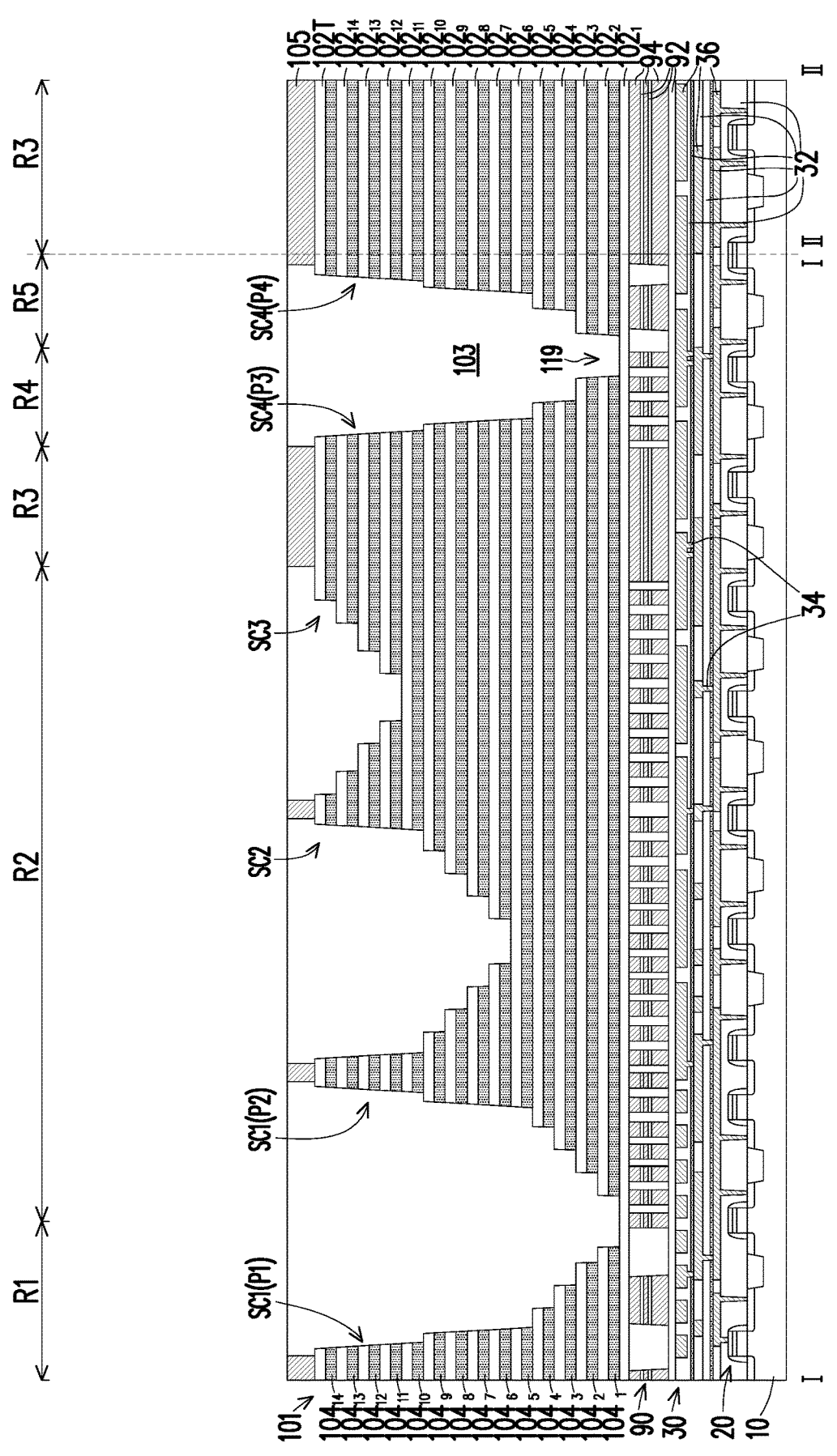

Referring to FIG. 2L, a dielectric layer 103 is formed on the substrate 10 to cover the staircase structures SC1, SC2, SC3, and SC4. The dielectric layer 103 has an inverted staircase structure. The material of the dielectric layer 103 is silicon oxide, for example. A method for forming the dielectric layer 103 may include, for example, forming a dielectric material layer to fill and cover the staircase structures SC1, SC2, SC3, and SC4 and the stop layer 105. Afterwards, a planarization process, such as a chemical-mechanical polishing process, is performed by using the stop layer 105 as a stop layer to remove the dielectric material layer above the stop layer 105.

Figure 2M:
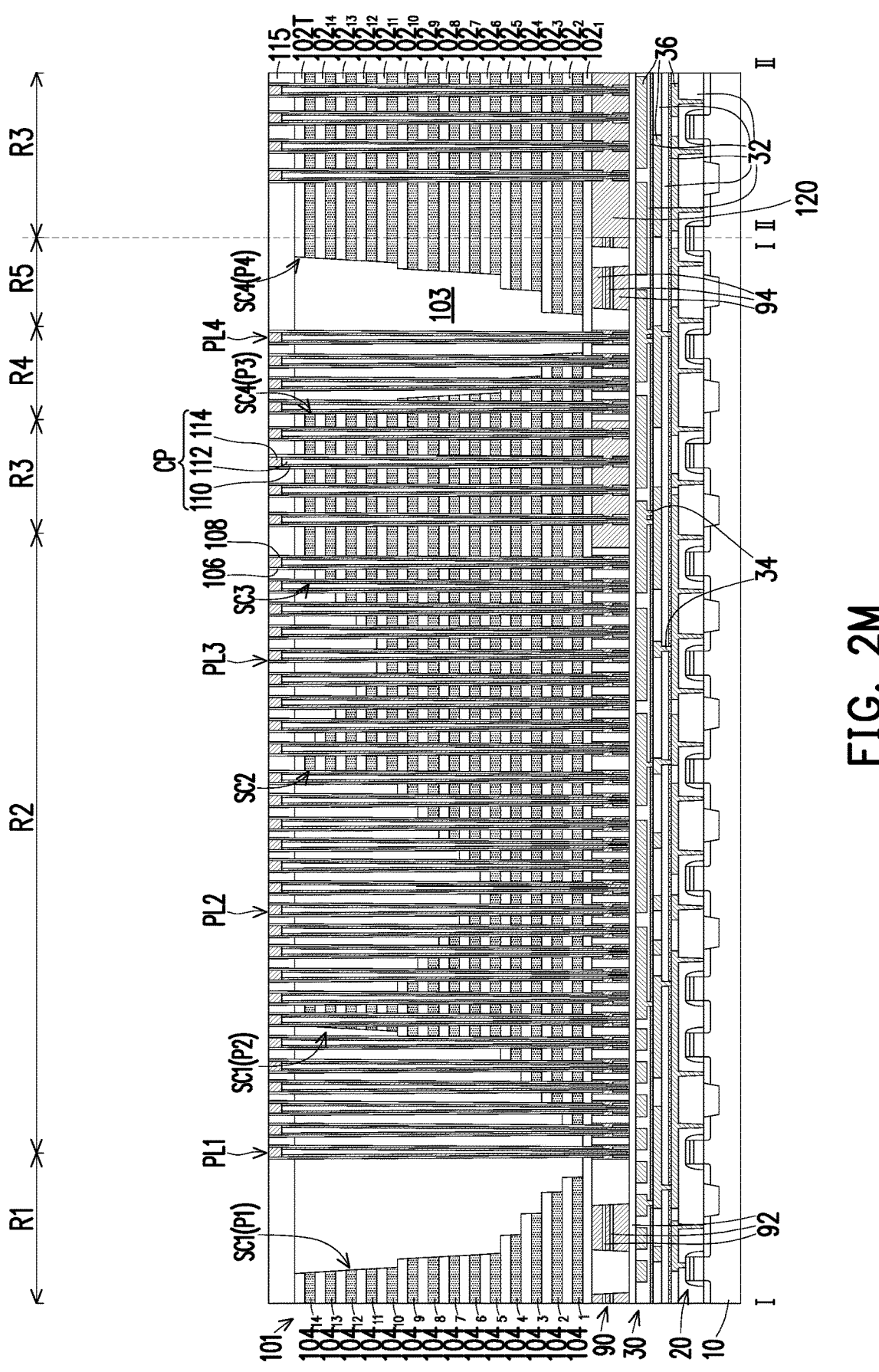

Referring to FIG. 2M, the stop layer 105 is removed. An insulating cap layer 115 is formed on the stack structure 101. In an embodiment, the material of the insulating cap layer 115 includes silicon oxide. Afterwards, a patterning process is performed to remove part of the insulating cap layer 115, part of the stack structure 101, and part of the stack structure 90 in the memory array region R3 to thereby form one or more openings 106 passing through the insulating cap layer 115, the stack structure 101, and the stack structure 90. In an embodiment, the opening 106 may have a slightly inclined sidewall, as shown in FIG. 2M. In another embodiment, the opening 106 may have a substantially vertical sidewall (not shown). In an embodiment, the opening 106 is also referred to as a vertical channel (VC) hole. Then, a vertical channel pillar CP is formed in the opening 106. The vertical channel pillar CP may be formed as described below but is not limited thereto.

Referring to FIG. 2M, a charge storage structure 108 is formed on the sidewall of the opening 106. The charge storage structure 108 is in contact with the insulating cap layer 115, the insulating layer 102, the sacrificial layer 104, the insulating layer 92, and the conductive layer 94. In an embodiment, the charge storage structure 108 is an oxide/nitride/oxide (ONO) composite layer. In an embodiment, the charge storage structure 108 is formed on the sidewall of the opening 106 in the form of a spacer and exposes the bottom surface of the opening 106.

Then, referring to FIG. 2M, a channel layer 110 is formed on the charge storage structure 108. In an embodiment, the material of the channel layer 110 includes polysilicon. In an embodiment, the channel layer 110 covers the charge storage structure 108 on the sidewall of the opening 106, and the channel layer 110 also cover the bottom surface of the opening 106. Next, an insulating pillar 112 is formed in the lower portion of the opening 106. In an embodiment, the material of the insulating pillar 112 includes silicon oxide, for example. Afterwards, a conductive plug 114 is formed in the upper portion of the opening 106, and the conductive plug 114 is in contact with the channel layer 110. In an embodiment, the material of the conductive plug 114 includes polysilicon, for example. The channel layer 110 and the conductive plug 114 may be collectively referred to as a vertical channel pillar CP. The charge storage structure 108 surrounds a vertical external surface of the vertical channel pillar CP.

In some embodiments, when the opening 106, the charge storage structure 108, and the vertical channel pillar CP are formed, at the same time, support structures PL1, PL2, PL3, and PL4 are formed in the staircase region R2 and the word line cutting region R4. It prevents collapse of the part P2 of the staircase structure SC1, the staircase structures SC2 and SC3, and the part P3 of the staircase structure SC4 in the subsequent process of removal of the sacrificial layer 104. The support structures PL1, PL2, PL3, and PL4 may respectively have the same structure as the structure of the combination of the charge storage structure 108 and the vertical channel pillar CP, but the disclosure is not limited thereto. In other embodiments, the support structures PL1, PL2, PL3, and PL4 may be formed separately, and their structure may be different from the structure of the combination of the charge storage structure 108 and the vertical channel pillar CP. In this embodiment, in the subsequent process, the sacrificial layer 104 of the part P1 of the staircase structure SC1, the part P4 of the staircase structure SC4, and the second zone A2 and third zone A3 of the staircase region R2 will not be removed. Therefore, it is not required to form a support structure in the part P1 of the staircase structure SC1, the part P4 of the staircase structure SC4, and the second zone A2 and the third zone A3 of the staircase region R2.

Figure 2N:
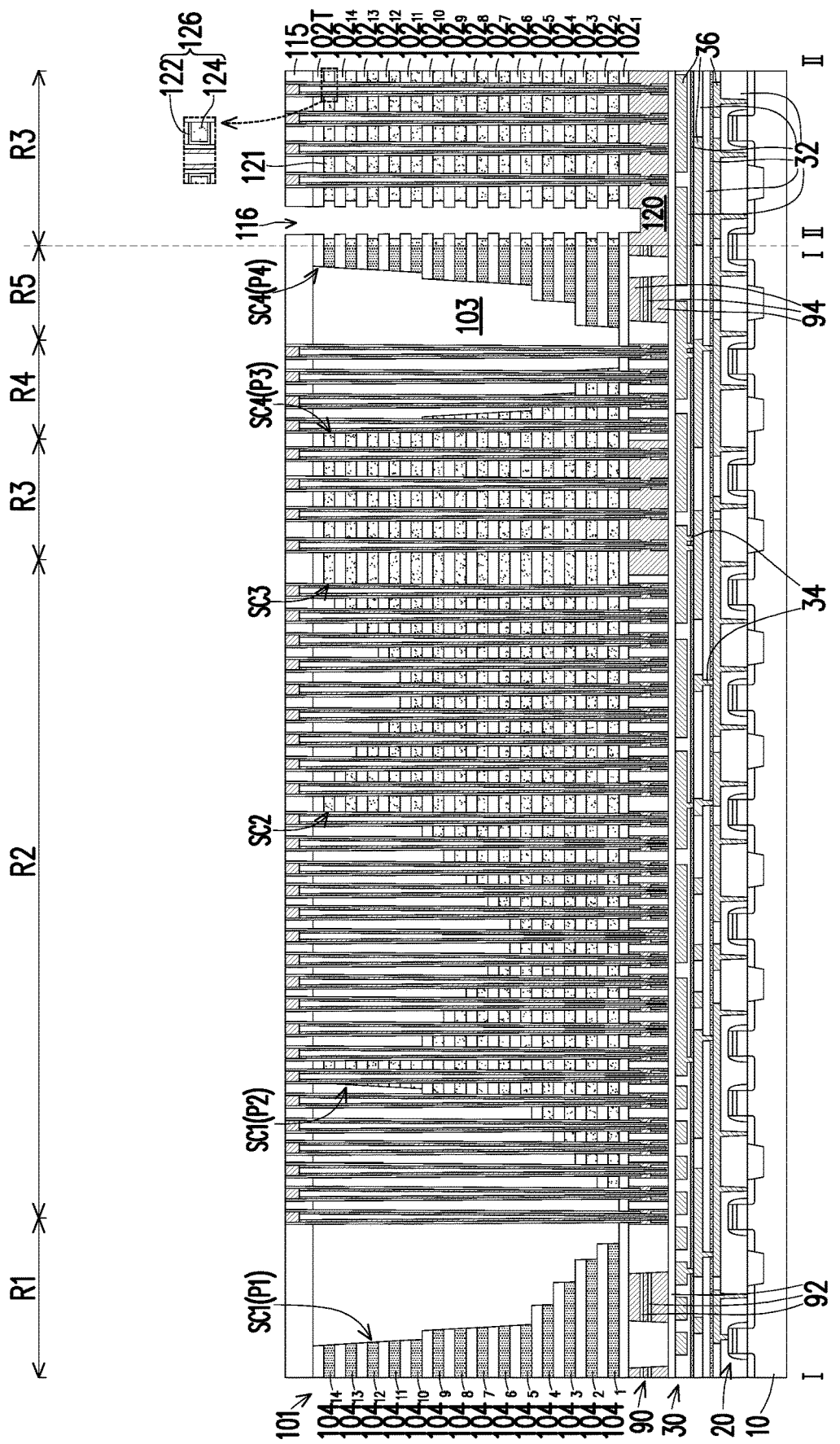
Figure 20:
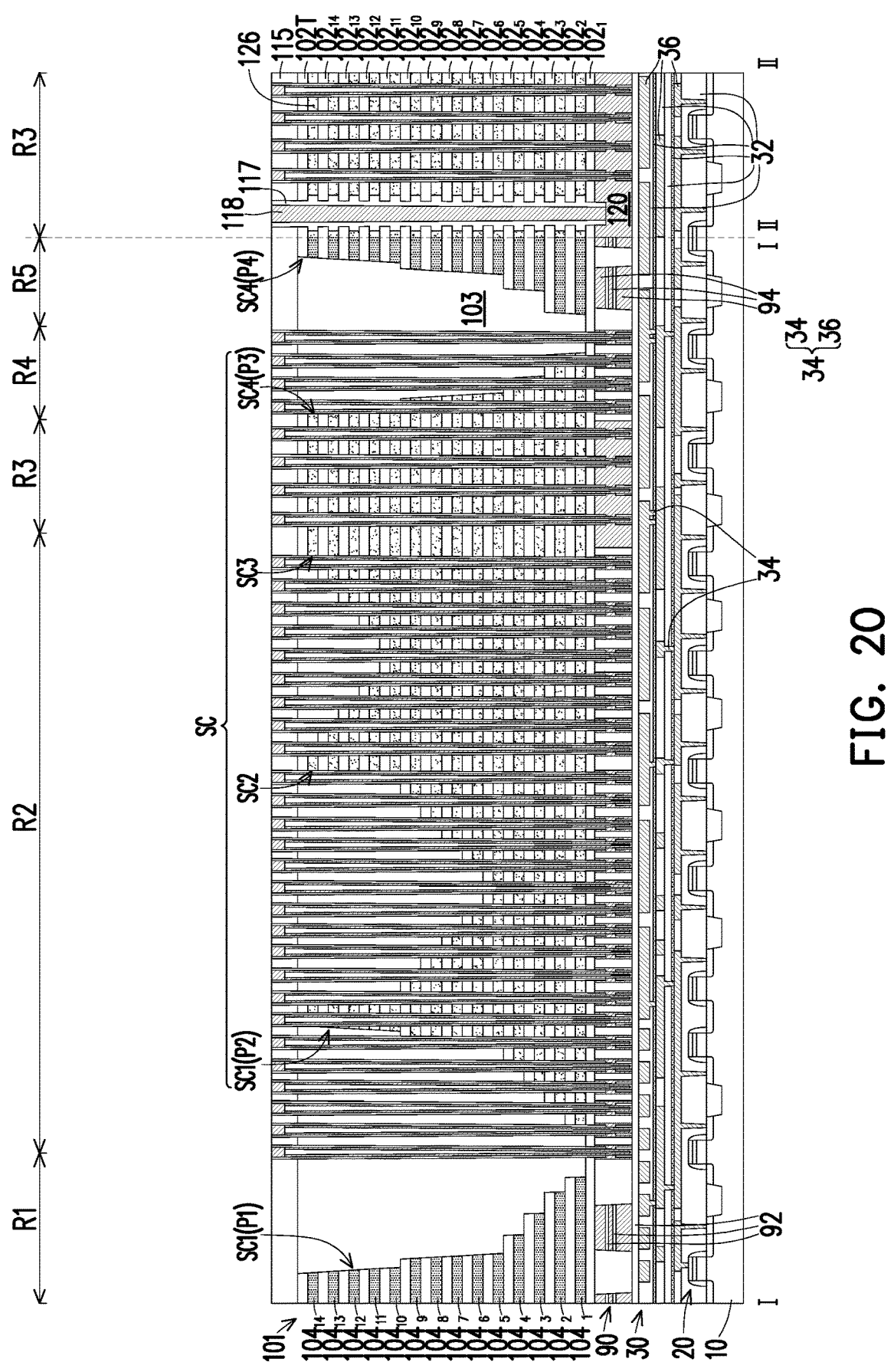
Figure 2P:
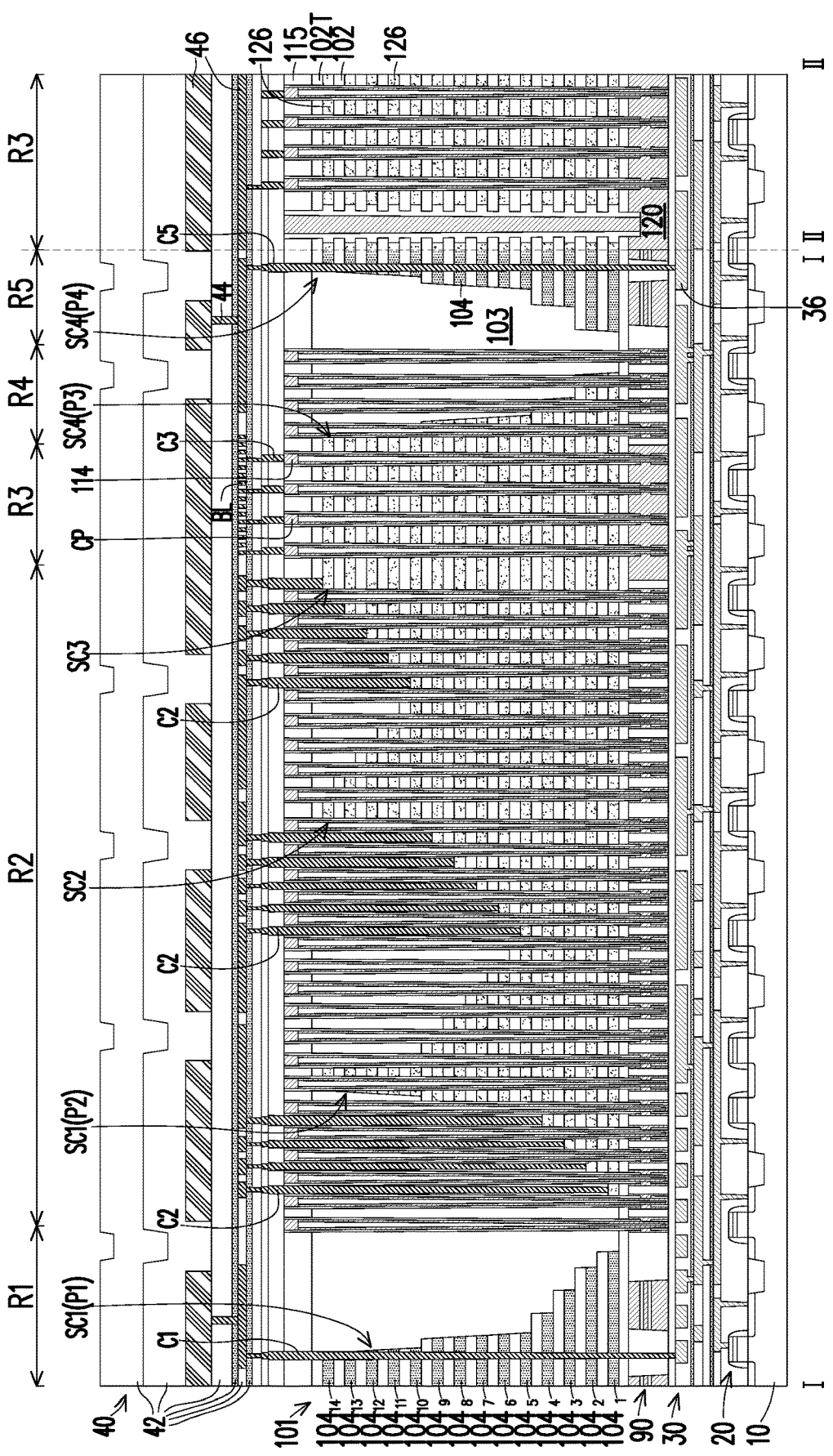

Referring to FIGS. 1 and 2N, a patterning process is performed to remove the insulating cap layer 115, part of the stack structure 101, and part of the stack structure 90 between two adjacent blocks B (e.g., between the fourth zone A4 of the block B1 and the first zone A1 of the block B2), to thereby form a plurality of trenches 116 passing through the insulating cap layer 115 and the stack structure 101 and passing through part of the stack structure 90. In an embodiment, the trench 116 may have a substantially vertical sidewall, as shown in FIG. 2N. In another embodiment, the trench 116 may have a slightly inclined sidewall (not shown). The trench 116 exposes the sidewalls of the insulating cap layer 115, the sacrificial layer 104, the insulating layer 102, the insulating layer 92, and the conductive layer 94.

Referring to FIGS. 1 and 2N, afterwards, a selective etching process is performed by flowing an etchant, via the trench 116, through the first zone A1 and the fourth zone A4 on two sides thereof, and then through the second zone A2 and the third zone A3. Accordingly, the sacrificial layer 104 of the part P2 of the staircase structure SC1, the staircase structures SC2 and SC3, and the part P3 of the staircase structure SC4 is removed to form a plurality of horizontal openings 121. The horizontal opening 121 exposes the sidewalls of part of the charge storage structure 108 and the insulating layer 102 in the memory array region R3, and exposes the sidewalls of part of the support structures PL1, PL2, PL3, and PL4. In this process, with the configuration of the support structures PL1, PL2, PL3 and PL4, it is possible to prevent collapse of the part P2 of the staircase structure SC1, the staircase structures SC2 and SC3, and the part P3 of the staircase structure SC4. The selective etching process may be isotropic etching, such as a wet etching process. The etchant used in the wet etching process is, for example, hot phosphoric acid. The etchant flows via the trench 116 into the first zone A1 and the fourth zone A4 in the staircase region R2, the memory array region R3, and the word line cutting region R4 of each block B, and extends to the second zone A2 and the third zone A3 in the memory array region R3 and the word line cutting region R4.

Referring to FIGS. 1 and 2N, the dielectric layer 103 separates the parts P1 and P2 of the staircase structure SC1 from each other, and separates the parts P3 and P4 of the staircase structure SC4 from each other. Therefore, the sacrificial layer 104 of the part P1 of the staircase structure SC1 and the part P4 of the staircase structure SC4 are blocked by the dielectric layer 103 and will not be removed but will be retained. In addition, in some embodiments, before the selective etching process is performed to remove the sacrificial layer 104, an insulating wall 113 is formed around the second zone A2 and the third zone A3 of the staircase region R2. Therefore, when the etchant flows via the trench 116 through the first zone A1 and the fourth zone A4 on both sides, due to the blocking of the insulating wall 113, the etchant cannot further flow through the second zone A2 and the third zone A3 of the staircase region R2, so the sacrificial layer 104 of the second zone A2 and the third zone A3 in the staircase region R2 is not removed but is retained.

Referring to FIG. 2N, then, a conductive layer is formed in the trench 116 and the horizontal opening 121. The conductive layer includes, for example, a barrier layer 122 and a metal layer 124. In an embodiment, the material of the barrier layer 122 includes titanium (Ti), titanium nitride (TiN), tantalum (Ta), tantalum nitride (TaN), or a combination thereof, and the material of the metal layer 124 includes tungsten (W), for example. The conductive layer in the horizontal opening 121 serves as a gate layer 126.

Referring to FIGS. 1 and 2N, the sacrificial layer 104 of the part P2 of the staircase structure SC1, the staircase structures SC2 and SC3, and the part P3 of the staircase structure SC4 is replaced with the gate layer 126. The sacrificial layer 104 of the part P1 of the staircase structure SC1 and the part P4 of the staircase structure SC4 is retained. The parts P1 and P2 of the staircase structure SC1 have symmetrical side profiles, but are formed by stacking different material layers. The part P1 of the staircase structure SC1 is formed by stacking the insulating layer 102 and the sacrificial layer 104, and the part P2 of the staircase structure SC1 is formed by stacking the insulating layer 102 and the gate layer 126. The staircase structures SC2 and SC3 are respectively formed by stacking the insulating layer 102 and the gate layer 126 and respectively have a symmetrical structure. The parts P3 and P4 of the staircase structure SC4 have symmetrical side profiles, but are formed by stacking different material layers. The part P3 of the staircase structure SC4 is formed by stacking the insulating layer 102 and the gate layer 126, and the part P4 of the staircase structure SC4 is formed by stacking the insulating layer 102 and the sacrificial layer 104. In some embodiments, the part P2 of the staircase structure SC1 and the staircase structures SC2 and SC3 in the staircase region R2 may be collectively referred to as a staircase structure SC. The part P2 of the staircase structure SC1 and the staircase structures SC2 and SC3 may be respectively referred to as sub-staircase structures of the staircase structure SC. This embodiment has been illustrated with three sub-staircase structures (e.g., P2, SC2, and SC3), but the disclosure is not limited thereto, and the staircase structure SC may include more or less sub-staircase structures.

Referring to FIG. 2O, next, a spacer 117 is formed on the sidewall of the trench 116. The spacer 117 includes a dielectric material different from the insulating layer 102, such as silicon nitride or a silicon oxide/silicon nitride/silicon oxide composite layer. Afterwards, the conductive layer 94 in the stack structure 90 in the memory array region R3 is removed, and the insulating layer 92 above and below the conductive layer 94 is removed to form horizontal openings (not shown) in the stack structure 90. Then, a conductive layer is filled in the trench 116 and the horizontal opening. The conductive layer in the horizontal opening and the conductive layer 94 above and below it collectively form a source line 120.

Referring to FIG. 2O, a conductive layer is formed in the trench 116 to form a source line slit 118 for conducting the current from the source line 120. The spacer 117 separates the source line slit 118 to avoid contact with the gate layer 126.

Referring to FIG. 1 and FIG. 2P, next, contacts C1 and C5 are formed in the periphery regions R1 and R5 to be electrically connected to the conductive layer 36 of the metal interconnect structure 30. A plurality of contacts C2 are formed in the first zone A1 and the fourth zone A4 of the staircase region R2 to be connected to the ends of the gate layers 126. A plurality of contacts (not shown) are formed in the second zone A2 and the third zone A3 of the staircase region R2 to be electrically connected to the conductive layer 36 of the metal interconnect structure 30. A plurality of contacts C3 are formed in the memory array region R3 to be electrically connected to the conductive plug 114 of the vertical channel pillar CP. The contacts C1, C2, C3, and C5 may be formed simultaneously or separately. In addition, the contacts C1, C2, C3, and C5 may each include one or more plugs. The plurality of plugs of the contacts C1, C2, C3, and C5 may be formed simultaneously or separately. In an embodiment, each of the contacts C1, C2, C3, and C5 may include a barrier layer and a conductive layer. The material of the barrier layer is, for example, titanium (Ti), titanium nitride (TiN), tantalum (Ta), tantalum nitride (TaN), or a combination thereof, and the material of the conductive layer is, for example, tungsten (W).

In some embodiments, the part P1 of the staircase structure SC1 is not electrically connected to the contact C1, contacts are not formed in the part P3 of the staircase structure SC4, and the part P4 of the staircase structure SC4 is not electrically connected to the contact C5. Therefore, the part P1 of the staircase structure SC1 and the staircase structure SC4 may also be referred to as dummy staircase structures.

Referring to FIG. 1 and FIG. 2P, a metal interconnect structure 40 is formed. The metal interconnect structure 40 may include a multi-layered dielectric layer 42, and a plurality of plugs 44, a plurality of conductive lines 46, etc. formed in the multi-layered dielectric layer 42. The dielectric layer 42 separates adjacent conductive lines 46. The conductive lines 46 may be connected to each other via the plugs 44, and the conductive lines 46 may be electrically connected to the contacts C1, C2, C3 and C5. The conductive line 46 connected to the contact C3 may serve as a bit line BL.

Afterwards, subsequent processes are performed to complete the fabrication of the memory device.

Figure 3:
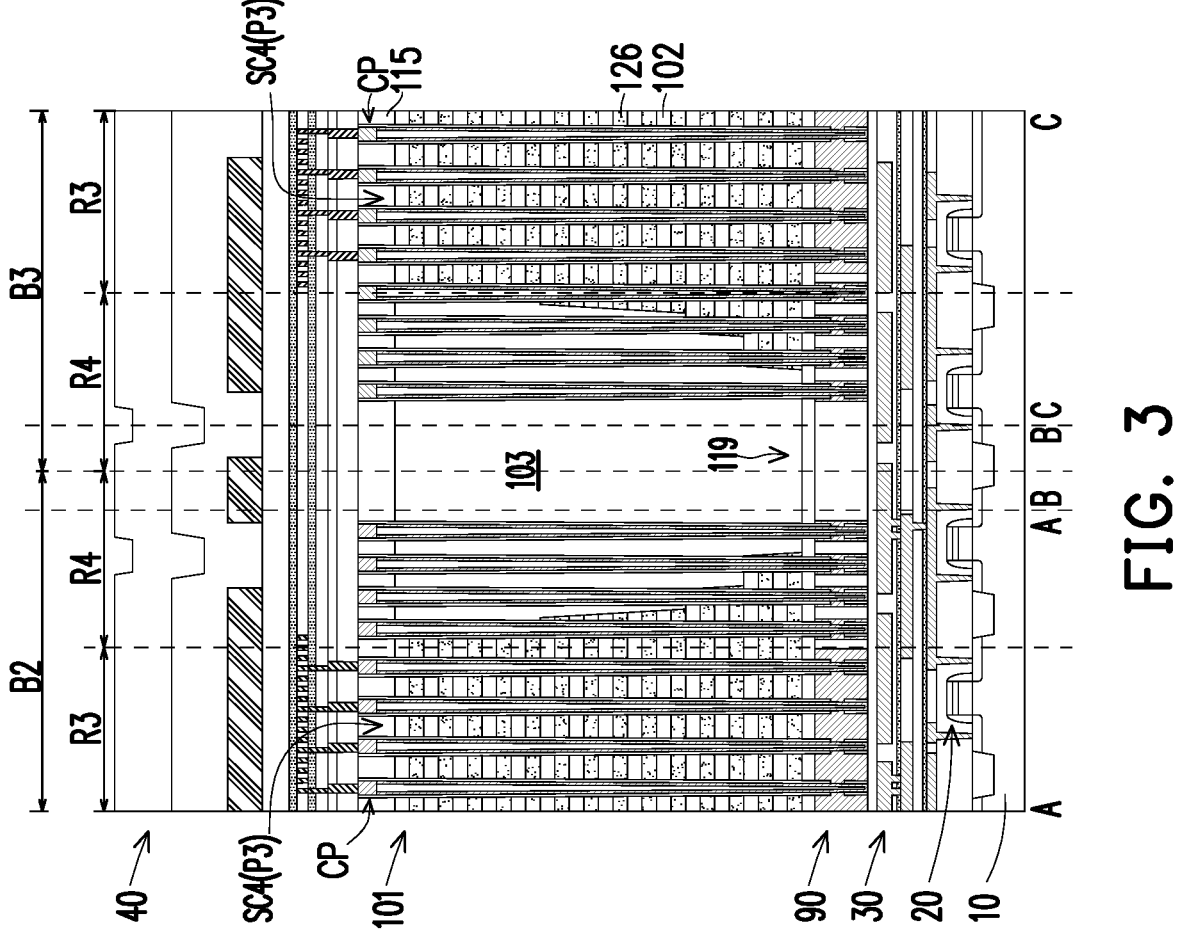
FIG. 3 is a schematic cross-sectional view taken along lines A-A, B-B. and C-C in FIG. 1.

Referring to FIG. 1, FIG. 2P, and FIG. 3, in some embodiments of the disclosure, in each block B, the part P3 of the staircase structure SC4 in the word line cutting region R4 and the part P4 of the staircase structure SC4 in the periphery region R5 are apart from each other and are completely separated by the dielectric layer 103, as shown in FIG. 2P. The parts P3 of the staircase structures SC4 of two adjacent blocks B (e.g., the blocks B2 and B3) are also apart from each other and are completely separated by the dielectric layer 103. Therefore, the gate layers (multiple word lines) 126 at the same level of two adjacent blocks B (e.g., the blocks B2 and B3) are apart from each other and are separated by the dielectric layer 103, as shown in FIG. 3.

Referring to FIG. 1. FIG. 2K, and FIG. 2L, in the above embodiment, the staircase structure SC4 of each block B continuously extends from the first zone A1 to the fourth zone A4 in the word line cutting region R4. Therefore, the part P3 of the staircase structure SC4 is separated from the part P4 of the staircase structure SC4 in the periphery region R5, and a trench 119 formed between them continuously extends from the block B1 to the block B4. As a result, the dielectric layer 103 located between the word line cutting region R4 and the periphery region R5 is also filled in the trench 119, and extends continuously from the block B1 to the block B4.

Figure 4A:
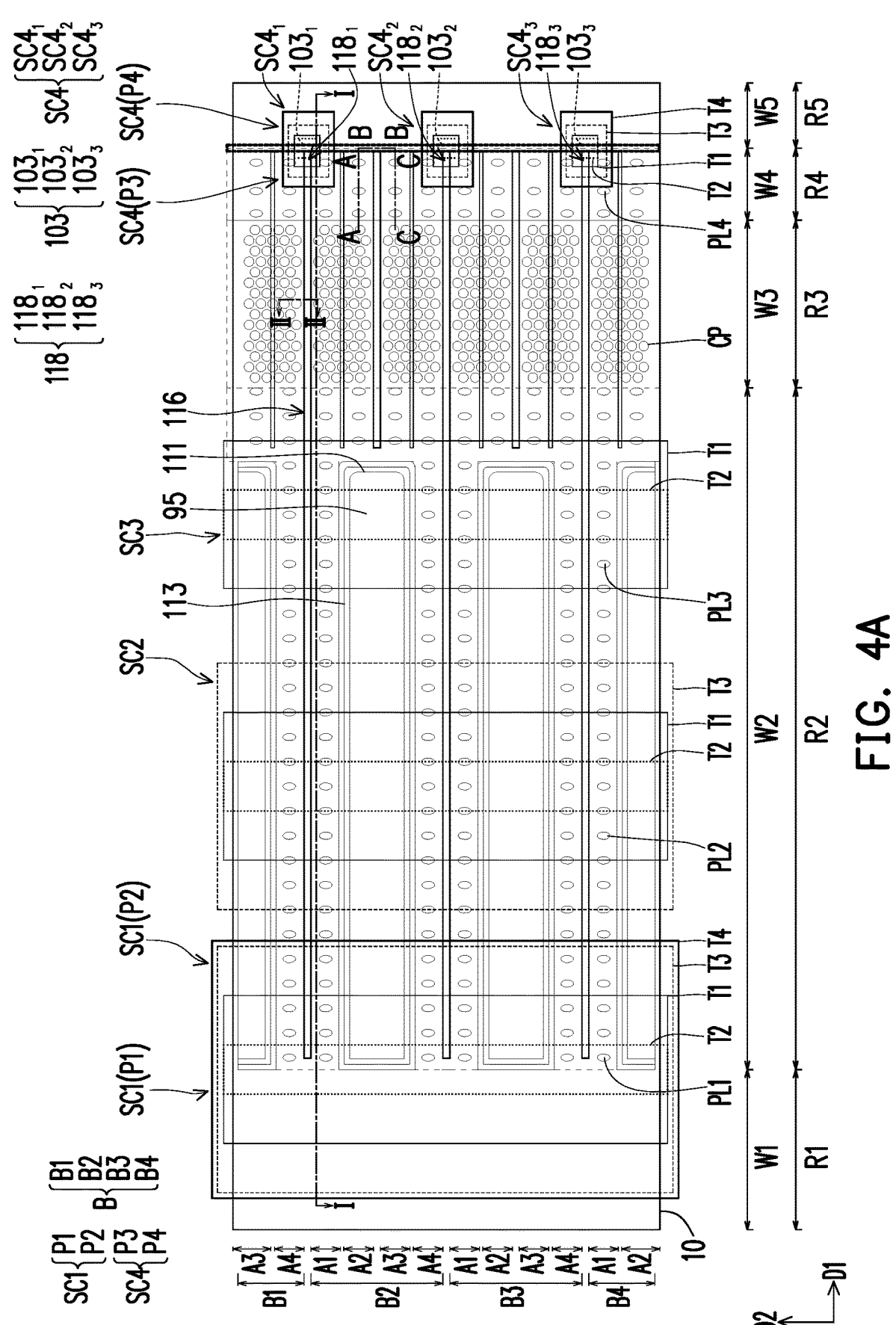
FIG. 4A, FIG. 5A, FIG. 6A, and FIG. 7A are respectively top views of a three-dimensional memory device according to embodiments of the disclosure.
Figure 4B:
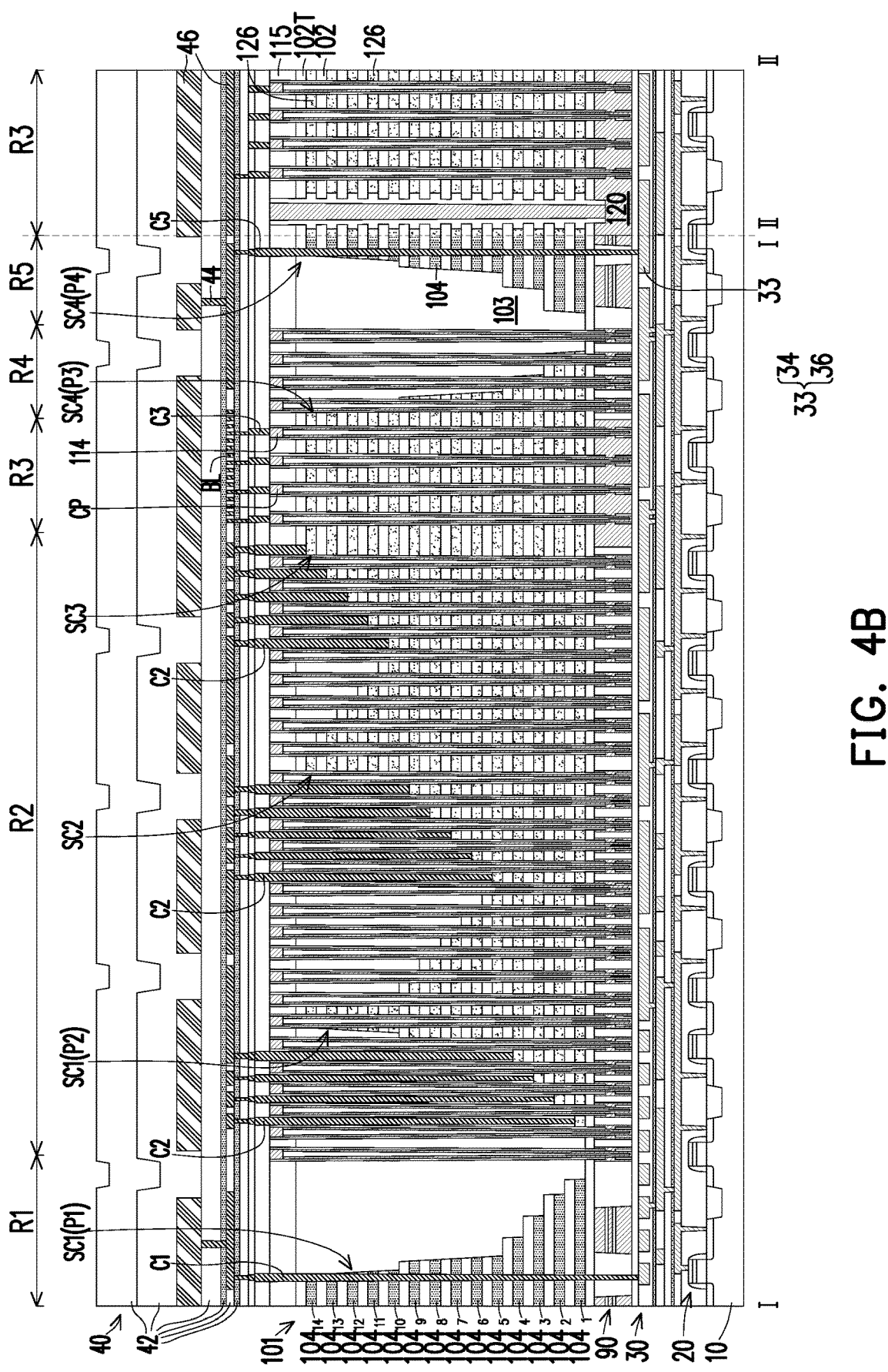
FIG. 4B, FIG. 5B, FIG. 6B, and FIG. 7B are respectively cross-sectional views taken along line I-I in FIG. 4A, FIG. 5A, FIG. 6A, and FIG. 7A.

Referring to FIGS. 4A and 4B, in other embodiments, the staircase structure SC4 in the word line cutting region R4 and the periphery region R5 does not extend continuously from the first zone A1 to the fourth zone A4, but includes a plurality of island-shaped staircase structures $SC4_1$, $SC4_2$ and $SC4_3$. The island-shaped staircase structures $SC4_1$, $SC4_2$, and $SC4_3$ are respectively formed at the end of the source line slit 118 between two adjacent blocks B. In other words, the island-shaped staircase structure $SC4_1$ is formed in the fourth zone A4 of the block B1 and the first zone A1 of the block B2, the island-shaped staircase structure $SC4_2$ is formed in the fourth zone A4 of the block B2 and the first zone A1 of the block B3, and the island-shaped staircase structure $SC4_3$ is formed in the fourth zone A4 of the block B3 and the first zone A1 of the block B4. In some embodiments, the island-shaped staircase structures $SC4_1$, $SC4_2$, and $SC4_3$ are formed through the four-stage patterning process (i.e., T1, T2, T3 and T4), but the disclosure is not limited thereto.

Therefore, the dielectric layer 103 of each block B does not continuously extend from the first zone A1 to the fourth zone A4 in the word line cutting region R4, but includes island-shaped dielectric layers $103_1$, $103_2$, and $103_3$ separated from each other. The island-shaped dielectric layers $103_1$, $103_2$, and $103_3$ are respectively formed at the ends of the source line slits 118 (i.e., $118_1$, $118_2$, and $118_3$) between two adjacent blocks B, as shown in FIG. 4A. In other words, the dielectric layer 103 is formed between two adjacent blocks B. For example, the island-shaped dielectric layer $103_1$ is formed in the fourth zone A4 of the block B1 and the first zone A1 of the block B2, the island-shaped dielectric layer $103_2$ is formed in the fourth zone A4 of the block B2 and the first zone A1 of the block B3, and the island-shaped dielectric layer $103_3$ is formed in the fourth zone A4 of the block B3 and the first zone A1 of the block B4.

The part P3 of the island-shaped structures SC4$_1$. SC4$_2$, and SC4$_3$ on the side of the island-shaped dielectric layers 103$_1$, 103$_2$, and 103$_3$ close to the memory array region R3 is formed by stacking the insulating layer 102 and the gate layer 126. The part P4 of the island-shaped structures SC4$_1$. SC4$_2$, and SC4$_3$ on the side of the island-shaped dielectric layer 103$_1$, 103$_2$, and 103$_3$ away from the memory array region R3 is formed by stacking the insulating layer 102 and the sacrificial layer 104. Other parts of the staircase structures SC4$_1$, SC4$_2$ and SC4$_3$ may be formed by stacking the insulating layer 102 and the gate layer 126, stacking the insulating layer 102 and the sacrificial layer 104, or a combination thereof.

Referring to FIG. 1 and FIG. 4A, in the above embodiment, a width W4 of the word line cutting region R4 is quite small and may be, for example, less than a width W1 of the periphery region R1, a width W2 of the staircase region R2, or a width W3 of the memory array region R3.

Figure 5A:
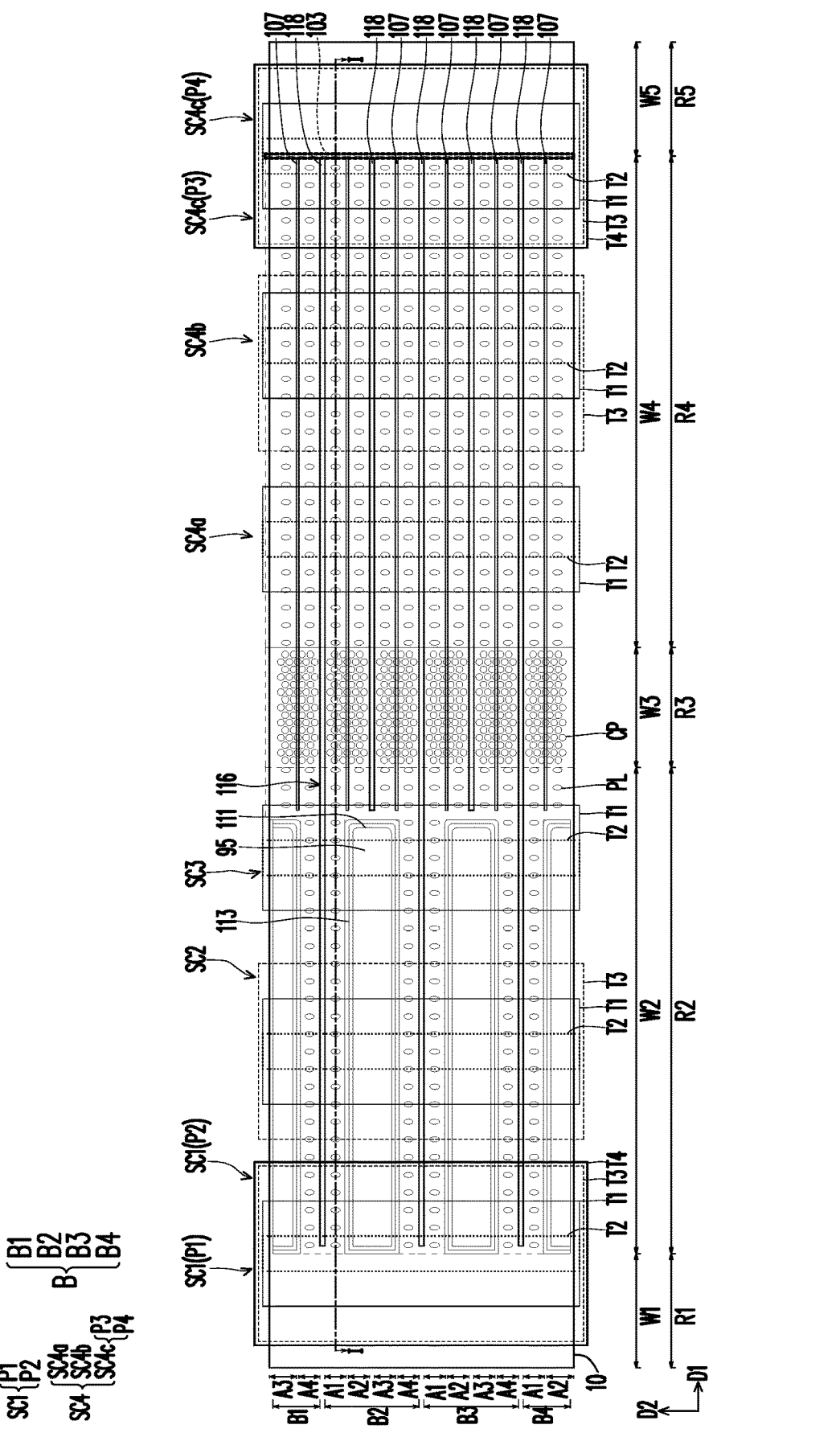
Figure 5B:
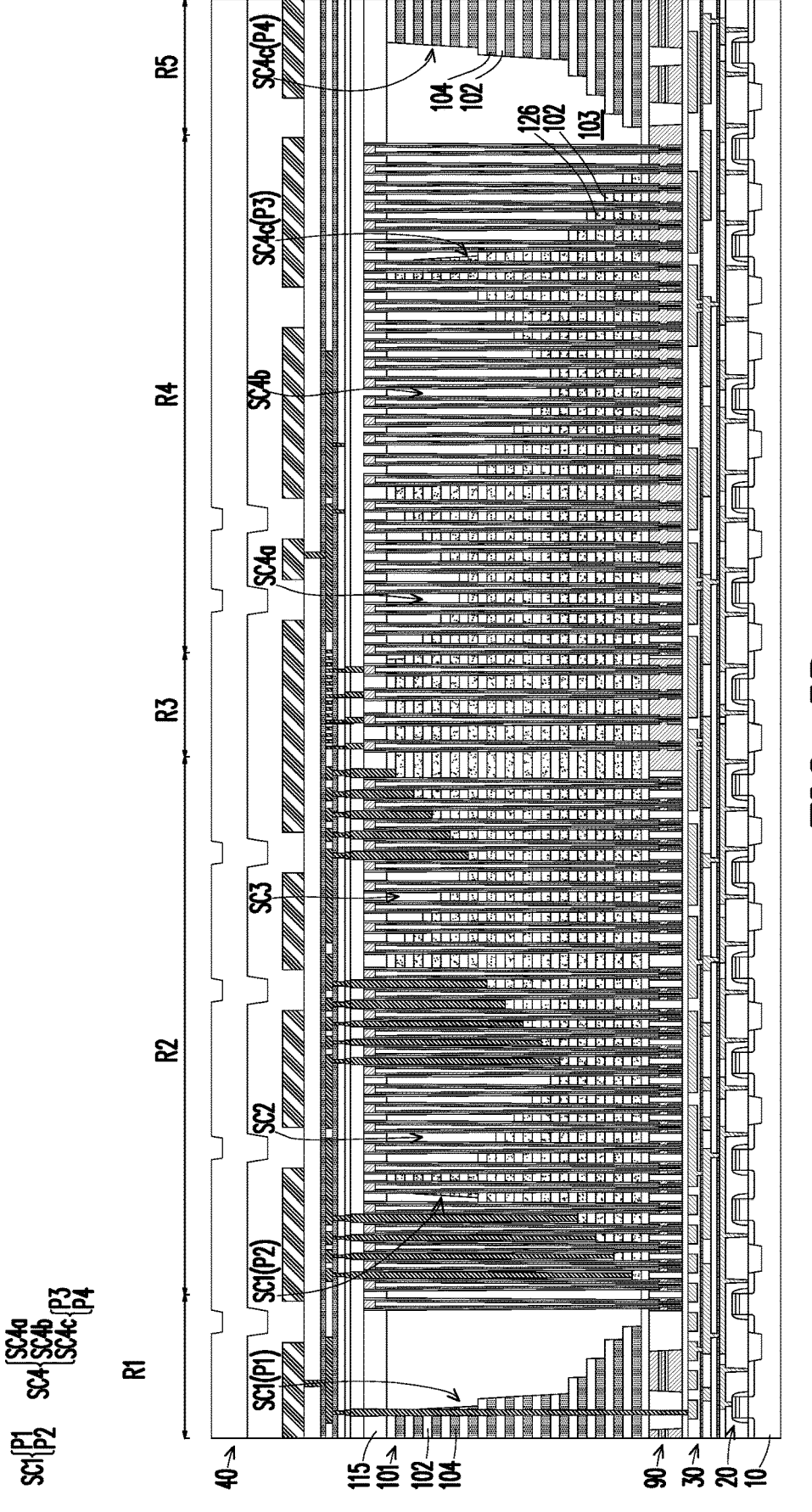

Referring to FIG. 5A and FIG. 5B, in another embodiment, the width W4 of the word line cutting region R4 may be equal to the width W2 of the staircase region R2. The staircase structure SC4 in the word line cutting region R4 and the periphery region R5 may include a plurality of sub-staircase structures SC4a, SC4b, and SC4c. The sub-staircase structure SC4a may have a similar width and a similar side profile to the staircase structure SC3, the sub-staircase structure SC4b may have a similar width and a similar side profile to the staircase structure SC2, and the sub-staircase structure SC4c may have a similar width and a similar side profile to the staircase structure SC1. The sub-staircase structures SC4a and SC4b are formed by stacking the insulating layer 102 and the gate layer 126. The sub-staircase structure SC4c includes the parts P3 and P4 separated from each other. The part P3 of the sub-staircase structure SC4c is formed by stacking the insulating layer 102 and the gate layer 126, and the part P4 of the sub-staircase structure SC4c is formed by stacking the insulating layer 102 and the sacrificial layer 104. In some embodiments, the sub-staircase structure SC4a is formed through the patterning processes of the first stage T1, and the second stage T2; the sub-staircase structures SC4b is formed through the patterning processes of the first stage T1, the second stage T2, and the third stage T3; and the sub-staircase structures SC4c is formed through the patterning processes of the first stage T1, the second stage T2, the third stage T3, and the fourth stage T4, but the disclosure is not limited thereto.

The dielectric layer 103 between the parts P3 and P4 of the sub-staircase structure SC4c extends continuously from the block B1 to the block B4 to separate the gate layer (word lines) 126 of adjacent blocks B from each other, as shown in FIG. 5A.

Figure 6A:
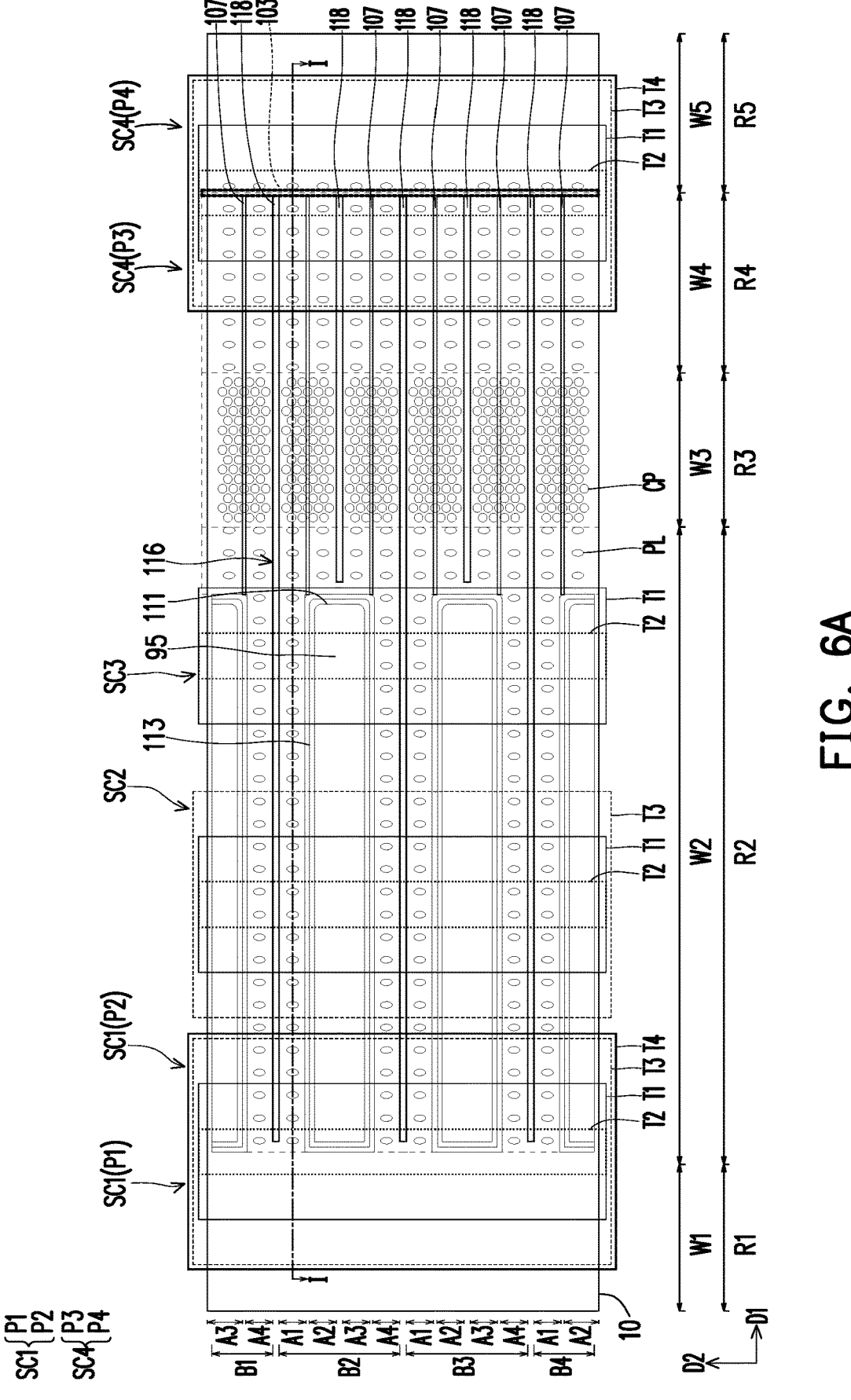
Figure 6B:
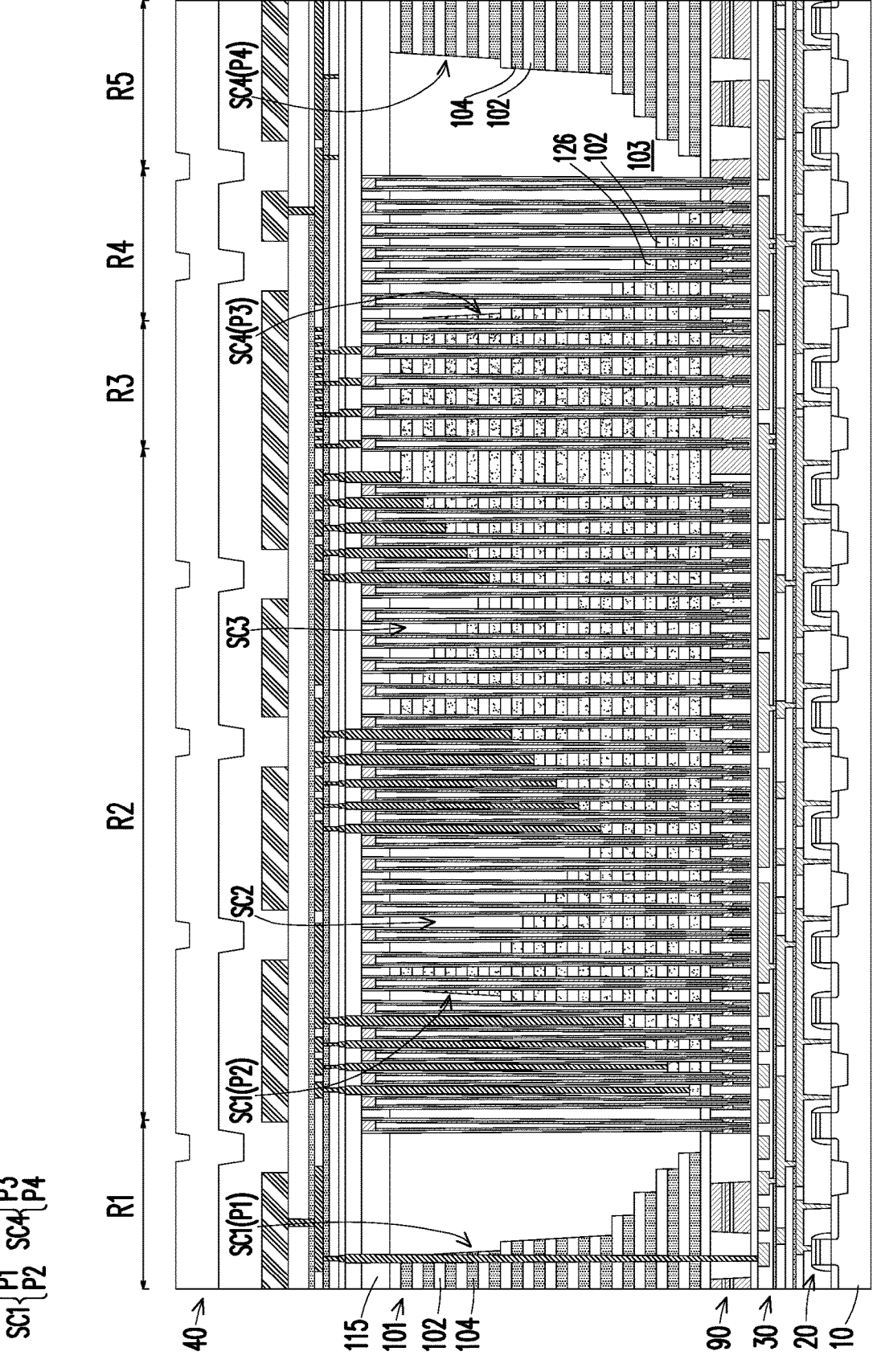

Referring to FIG. 6A and FIG. 6B, in another embodiment, the staircase structure SC4 in the word line cutting region R4 and the periphery region R5 may have a similar width and a similar side profile to the staircase structure SC1 in the periphery region R1 and the staircase region R2. Similarly, the staircase structure SC4 includes the parts P3 and P4 separated from each other. The part P3 of staircase structure SC4 is formed by stacking the insulating layer 102 and the gate layer 126, and the part P4 of the staircase structure SC4 is formed by the stacking insulating layer 102 and the sacrificial layer 104. In some embodiments, the staircase structures SC4 is formed through the four-stage patterning process (i.e., T1, T2, T3 and T4), but the disclosure is not limited thereto.

The dielectric layer 103 between the parts P3 and P4 of the staircase structure SC4 extends continuously from the block B1 to the block B4 to separate the gate layers (the word lines) 126 of adjacent blocks B from each other, as shown in FIG. 6A.

Figure 7A:
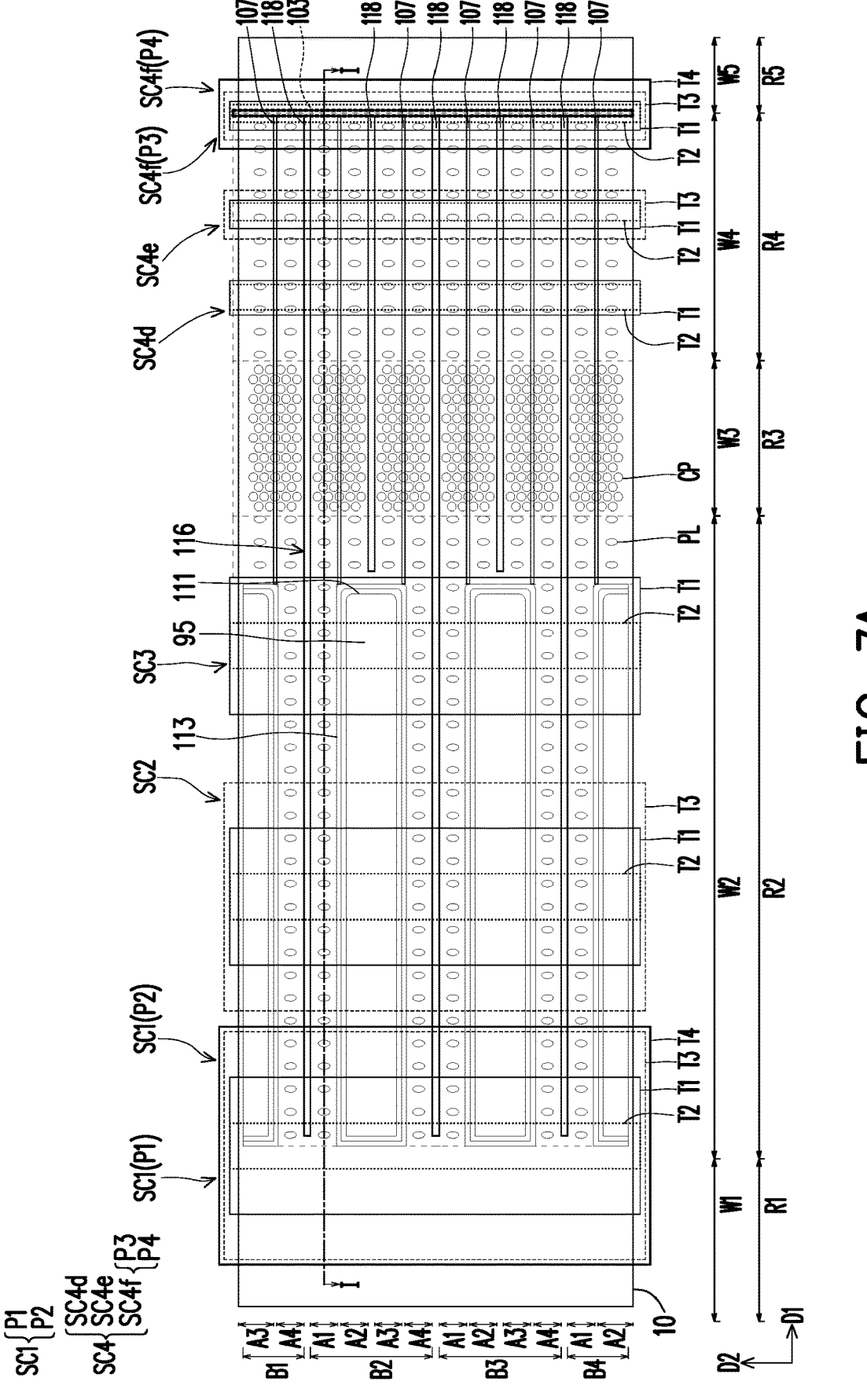
Figure 7B:
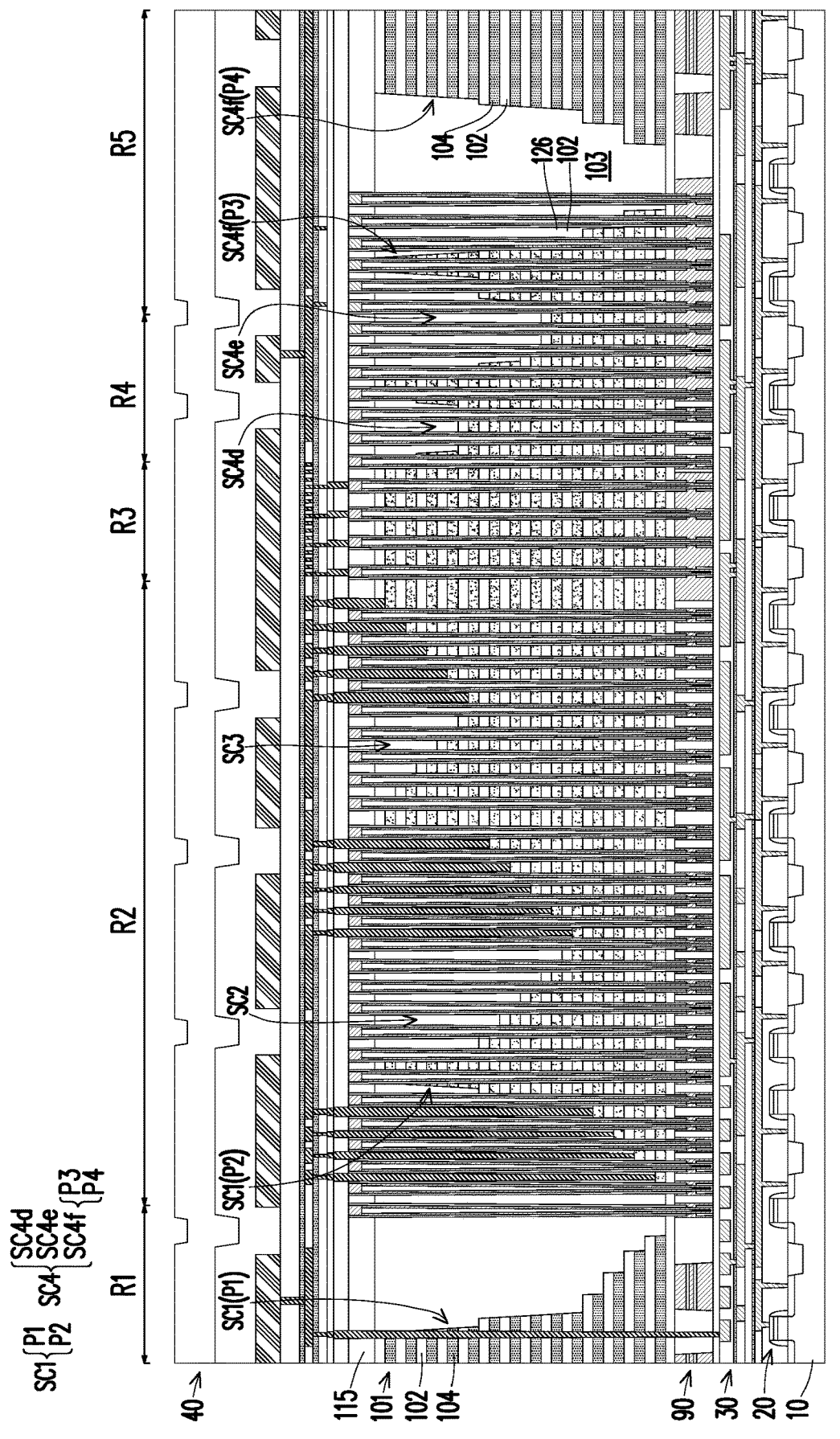

Referring to FIG. 7A and FIG. 7B, in another embodiment, the staircase structure SC4 in the word line cutting region R4 and the periphery region R5 includes a plurality of sub-staircase structures SC4d, SC4e, and SC4f. The widths of the sub-staircase structures SC4d, SC4e, and SC4f are respectively less than the widths of staircase structures SC3, SC2, and SC1. The sub-staircase structures SC4d and SC4e are respectively formed by stacking the insulating layer 102 and the gate layer 126. The sub-staircase structure SC4f includes the parts P3 and P4 separated from each other. The part P3 of the sub-staircase structure SC4f is formed by stacking the insulating layer 102 and the gate layer 126, and the part P4 of the staircase structure SC4f is formed by stacking the insulating layer 102 and the sacrificial layer 104. In some embodiments, the sub-staircase structure SC4d is formed through the patterning processes of the first stage T1, and the second stage T2; the sub-staircase structures SC4e is formed through the patterning processes of the first stage T1, the second stage T2, and the third stage T3; and the sub-staircase structures SC4f is formed through the patterning processes of the first stage T1, the second stage T2, the third stage T3, and the fourth stage T4, but the disclosure is not limited thereto.

The dielectric layer 103 between the parts P3 and P4 of the staircase structure SC4f continuously extends from the block B1 to the block B4 to separate gate layers (the word lines) 126 of adjacent blocks B from each other, as shown in FIG. 7A.

In the embodiments of the disclosure, the stack structure between two adjacent blocks is patterned into two parts of the staircase structure separated from each other, and a dielectric layer having an inverted staircase structure is disposed between them to separate the multiple word lines of different blocks from each other and prevent a short circuit between the multiple word lines of the two blocks. Furthermore, since the staircase structure between the two adjacent blocks may be formed simultaneously with the staircase structure of the staircase region, it may be integrated with the existing fabrication process without increasing the cost and burden in fabrication.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory device, comprising:
a substrate having a staircase region, a word line cutting region and a memory array region, wherein the memory array region is located between the staircase region and the word line cutting region;
a stack structure in the memory array region, wherein the stack structure comprises a plurality of first insulating layers and a plurality of conductive layers stacked alternately on each other;
a first staircase structure located in the staircase region, wherein the first staircase structure comprises the plurality of first insulating layers and the plurality of conductive layers stacked alternately on each other;

a second staircase structure located in the word line cutting region, wherein the second staircase structure comprises the plurality of first insulating layers and the plurality of conductive layers stacked alternately on each other, and the second staircase structure has steps descending from an upper layer proximal to the memory array region to a lower layer distal to the memory array region; and block slits and zone slits disposed over the substrate in the word line cutting region, wherein the block slits divide the stack structure, the first staircase structure and the second staircase structure into memory blocks, and the zone slits divide one of the memory blocks into a plurality of zones separately within the memory blocks, wherein a width of the word line cutting region is less than a width of the staircase region.

2. The memory device according to claim 1, wherein a number of steps of the second staircase structure is less than a number of steps of the first staircase structure.

3. The memory device according to claim 1, wherein the second staircase structure is a dummy staircase structure.

4. The memory device according to claim 1, wherein no contact plug is formed in the second staircase structure.

5. The memory device according to claim 4, further comprising a plurality of first contacts respectively connected to the plurality of conductive layers of the first staircase structure.

6. The memory device according to claim 1, wherein the substrate further has a periphery region adjacent to the word line cutting region, and the word line cutting region is located between the memory array region and the periphery region, and the plurality of first insulating layers and the plurality of conductive layers stacked alternately on each other having steps descending in the word line cutting region are a first part of the second staircase structure, and the plurality of first insulating layers and a plurality of second insulating layers stacked alternately on each other in the periphery region are a second part of the second staircase structure and have steps ascending from the lower layer proximal to the first part to the upper layer distal from the first part.

7. The memory device according to claim 6, wherein the plurality of conductive layers in the first part of the second staircase structure are separated from the plurality of second insulating layers in the second part of the second staircase structure.

8. The memory device according to claim 1, wherein the plurality of conductive layers of the first staircase structure are connected to the plurality of conductive layers of the stack structure and the plurality of conductive layers of the second staircase structure.

9. The memory device according to claim 1, further comprising a device layer under the stack structure and over the substrate.

10. The memory device according to claim 1, wherein a trench extends along a direction at an end of each of the second staircase structure in two adjacent zones.

11. A memory device comprising:

a substrate having a staircase region, a word line cutting region and a memory array region, wherein the memory array region is located between the staircase region and the word line cutting region;

a stack structure in the memory array region, wherein the stack structure comprises a plurality of first insulating layers and a plurality of conductive layers stacked alternately on each other;

a first staircase structure located in the staircase region, wherein the first staircase structure comprises the plurality of first insulating layers and the plurality of conductive layers stacked alternately on each other;

a second staircase structure located in the word line cutting region, wherein the second staircase structure comprises the plurality of first insulating layers and the plurality of conductive layers stacked alternately on each other, and has steps descending from an upper layer proximal to the memory array region to a lower layer distal to the memory array region; and at least two block slits and at least one zone slit disposed over the substrate in the word line cutting region, wherein the at least two block slits divide the stack structure, the first staircase structure and the second staircase structure to define a memory block, and the at least one zone slit divides the memory block into two adjacent zones within the memory block separately, wherein a width of the word line cutting region is less than a width of the staircase region.

12. The memory device according to claim 11, wherein a number of steps of the second staircase structure is less than a number of steps of the first staircase structure.

13. The memory device according to claim 11, wherein no contact plug is formed in the second staircase structure.

14. The memory device according to claim 13, further comprising a plurality of first contacts respectively connected to the plurality of conductive layers of the first staircase structure.

15. The memory device according to claim 11, further comprising a device layer under the stack structure and over the substrate.

16. The memory device according to claim 11, wherein the substrate further has a periphery region adjacent to the word line cutting region, and the word line cutting region is located between the memory array region and the periphery region, and the plurality of first insulating layers and the plurality of conductive layers stacked alternately on each other having steps descending in the word line cutting region are a first part of the second staircase structure, and the plurality of first insulating layers and a plurality of second insulating layers stacked alternately on each other in the periphery region are a second part of the second staircase structure and have steps ascending from the lower layer proximal to the first part to the upper layer distal from the first part.

17. The memory device according to claim 16, wherein the plurality of conductive layers in the first part of the second staircase structure are separated from the plurality of second insulating layers in the second part of the second staircase structure.

18. The memory device according to claim 16, wherein a side profile of the second part of the second staircase structure is symmetrical with a side profile of the first part of the second staircase structure.

* * * * *